(12) United States Patent
Strenz et al.

(10) Patent No.: US 9,559,108 B2
(45) Date of Patent: Jan. 31, 2017

(54) CHIP AND AN ELECTRONIC DEVICE

(71) Applicant: Infineon Technologies Dresden GmbH, Dresden (DE)

(72) Inventors: Robert Strenz, Radebeul (DE); Mayk Roehrich, Dresden (DE); Wolfram Langheinrich, Dresden (DE); John Power, Tainan (TW); Danny Shum, Tainan (TW); Martin Stiftinger, Stockdorf (DE)

(73) Assignee: INFINEON TECHNOLOGIES DRESDEN GMBH, Dresden (DE)

( * ) Notice: Subject to any disclaimer, the term of this patent is extended or adjusted under 35 U.S.C. 154(b) by 0 days.

(21) Appl. No.: 14/719,392

(22) Filed: May 22, 2015

(65) Prior Publication Data
US 2015/0255477 A1    Sep. 10, 2015

Related U.S. Application Data

(63) Continuation of application No. 13/751,185, filed on Jan. 28, 2013, now Pat. No. 9,040,375.

(51) Int. Cl.
H01L 27/115    (2006.01)
H01L 21/8247   (2006.01)
(Continued)

(52) U.S. Cl.
CPC ... *H01L 27/11548* (2013.01); *H01L 21/28273* (2013.01); *H01L 21/28282* (2013.01); *H01L 21/76895* (2013.01); *H01L 21/76897* (2013.01); *H01L 27/11524* (2013.01); *H01L 27/11529* (2013.01); *H01L 27/11534* (2013.01); *H01L 27/11556* (2013.01); *H01L 29/4234* (2013.01); *H01L 29/42324* (2013.01); *H01L 29/66825* (2013.01); *H01L 29/66833* (2013.01)

(58) Field of Classification Search
CPC .................. H01L 27/115; H01L 27/11521
See application file for complete search history.

(56) References Cited

U.S. PATENT DOCUMENTS 6,255,170 B1 * 7/2001 Yu .................. H01L 27/115
                                              257/E21.68
6,261,907 B1 * 7/2001 Chang ............. G11C 16/0416
                                             257/E21.689

(Continued)

FOREIGN PATENT DOCUMENTS

CN          1197293 A    10/1998

*Primary Examiner* — Su C Kim
*Assistant Examiner* — Regan J Rundio
(74) *Attorney, Agent, or Firm* — Viering, Jentschura & Partner mbB

(57) ABSTRACT

A method for processing a carrier accordance with various embodiments may include: forming a structure over the carrier, the structure including at least two adjacent structure elements arranged at a first distance between the same; depositing a spacer layer over the structure, wherein the spacer layer may be deposited having a thickness greater than half of the first distance, wherein the spacer layer may include electrically conductive spacer material; removing a portion of the spacer layer, wherein spacer material of the spacer layer may remain in a region between the at least two adjacent structure elements; and electrically contacting the remaining spacer material.

16 Claims, 10 Drawing Sheets

(51) Int. Cl.
    *H01L 21/336*     (2006.01)
    *H01L 21/8239*     (2006.01)
    *H01L 21/28*     (2006.01)
    *H01L 29/423*     (2006.01)
    *H01L 29/66*     (2006.01)
    *H01L 21/768*     (2006.01)

(56) References Cited

U.S. PATENT DOCUMENTS

| | | |
|---|---|---|
| 6,400,027 B1 | 6/2002 | Takahashi |
| 2005/0090063 A1* | 4/2005 | Lee ............... H01L 21/76895 |
| | | 438/267 |
| 2005/0170578 A1 | 8/2005 | Hsiao et al. |
| 2007/0069296 A1* | 3/2007 | Park ............... H01L 27/228 |
| | | 257/351 |
| 2010/0041197 A1 | 2/2010 | Yamamoto |
| 2012/0139025 A1* | 6/2012 | Gely ............... G11C 16/0433 |
| | | 257/316 |

* cited by examiner

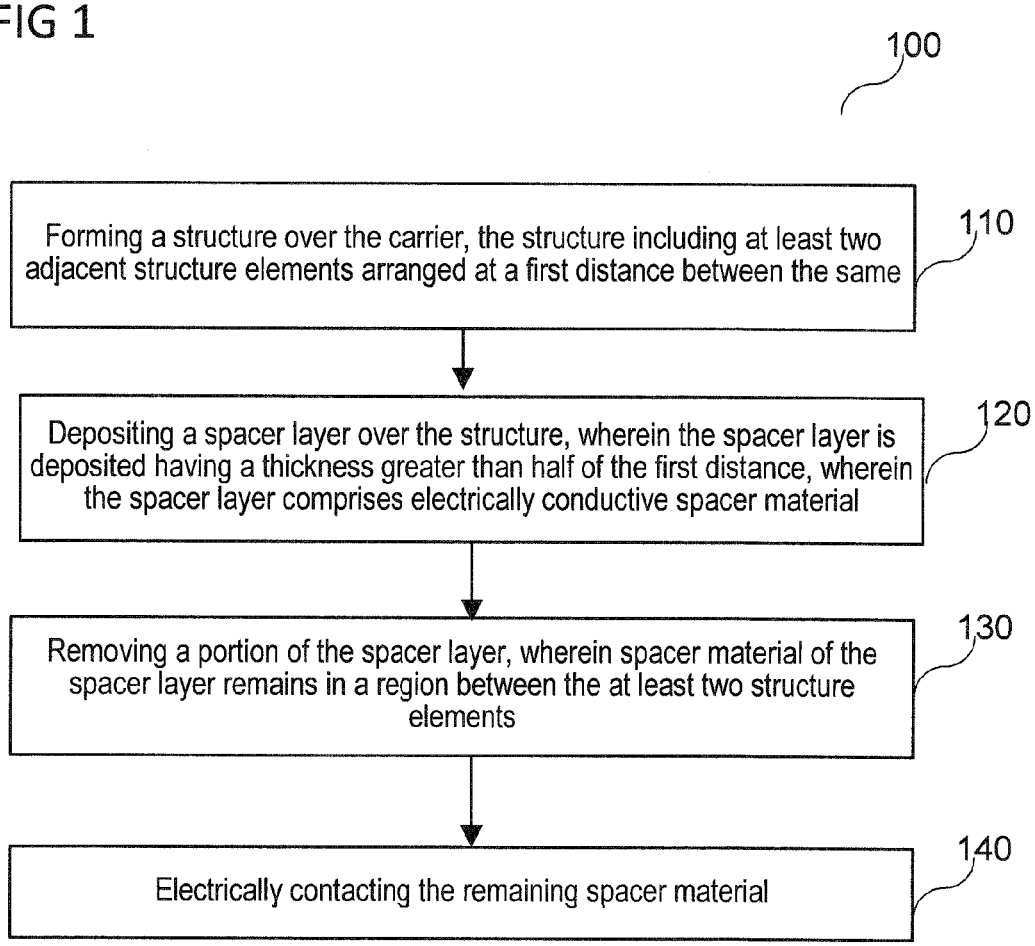

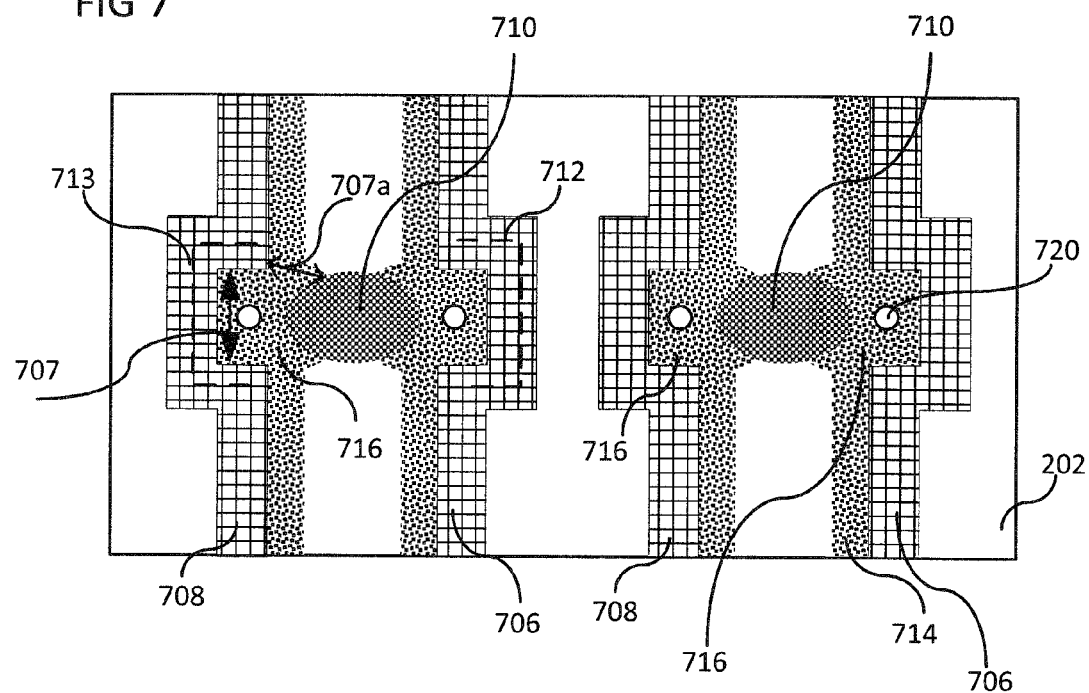
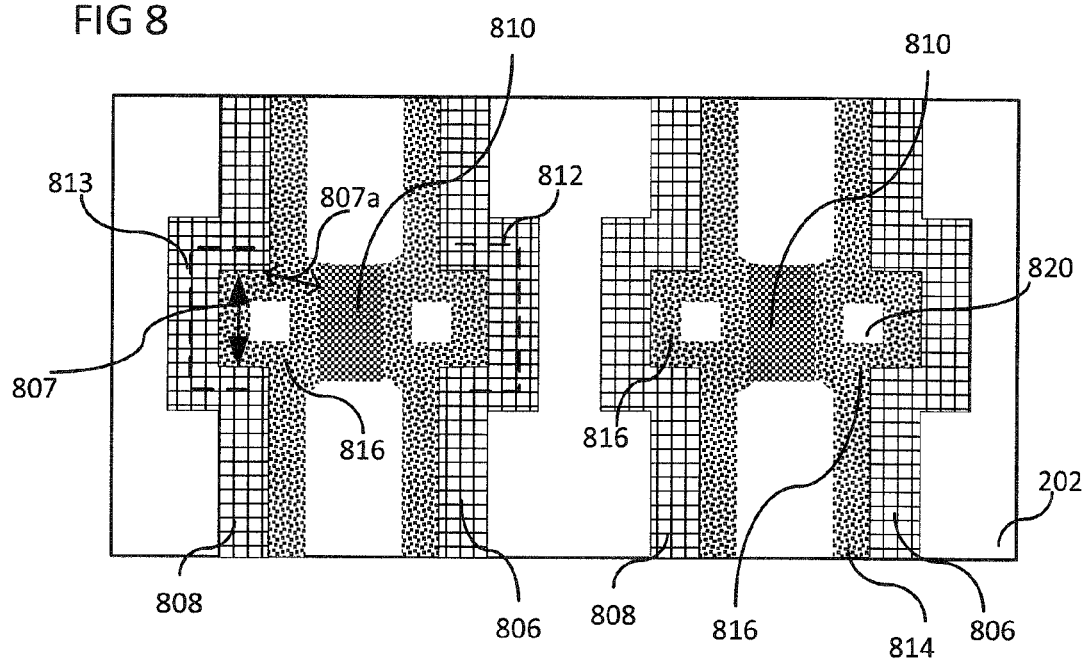

CHIP AND AN ELECTRONIC DEVICE

CROSS-REFERENCE TO RELATED APPLICATIONS

The present application is a Continuation Application of U.S. patent application Ser. No. 13/751,185 filed Jan. 28, 2013, the entirety of which is herein incorporated by reference.

TECHNICAL FIELD

Various embodiments relate generally to a method for processing a carrier, a method for fabricating a charge storage memory cell, a method for processing a chip, and a method for electrically contacting a spacer structure.

BACKGROUND

Fabricating an integrated circuit (also referred to as IC, chip, or microchip) typically involves a plurality of processes. One development in semiconductor processing is the scaling of the integrated circuits to realize the smallest practicable feature size. Another driver in semiconductor industry is reducing the production costs. One way to reduce costs may be directly related with the number of required processes, wherein it is usually desired to use only as little number of processes as possible. Since errors or deviations from the optimally designed configuration may be introduced by the processes, due to misalignment, a limited overlay accuracy, inhomogeneities resulting from deposition processes and etch processes, a reduced number of processes may not only reduce the cost, it may also increase the yield, increase the reproducibility of the overall process, minimize the number of defective structural elements, and may reduce the time for the production of an electronic component.

In this regard, electrically contacting small structure elements (small meaning that the lateral extension of the structure element may be in the range of the according feature size of the planar processing) may cause problems if the size of the electrical contact is likewise small and the overlay accuracy of involved patterning processes may become relevant. Therefore, the electrically contacting of a structure element may be unreliable for structures, where the lateral extension of the structure element is not significantly larger than the electrical contact itself. According to this, additional processes are typically involved generating a larger contact landing area including one or more deposition processes, lithographic processes, etch processes (and the like) which may be undesired as described above, since the number of processes may increase.

SUMMARY

A method for processing a carrier in accordance with various embodiments may include: forming a structure over the carrier, the structure including at least two adjacent structure elements arranged at a first distance between the same; depositing a spacer layer over the structure, wherein the spacer layer may be deposited having a thickness greater than half of the first distance, wherein the spacer layer may include electrically conductive spacer material; removing a portion of the spacer layer, wherein spacer material of the spacer layer may remain in a region between the at least two adjacent structure elements; and electrically contacting the remaining spacer material.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a method for processing a carrier in a flow diagram in accordance with various embodiments;

FIG. 7 schematically shows a top view of the carrier including a plurality of structure elements, wherein the structure elements are formed in a U-shape and spacer material respectively remains between at least two parts of a sidewall of a structure element and between the structure element and an additional dummy structure element as well, wherein the dummy structure element has an elliptical shape, in accordance with various embodiments;

FIG. 8 schematically shows a top view of the carrier including a plurality of structure elements, wherein the structure elements are formed in a U-shape and spacer material respectively remains between at least two parts of a sidewall of a structure element and between the structure element and an additional dummy structure element as well, wherein the dummy structure element has an rectangular shape, in accordance with various embodiments.

DESCRIPTION

Figure 2A:
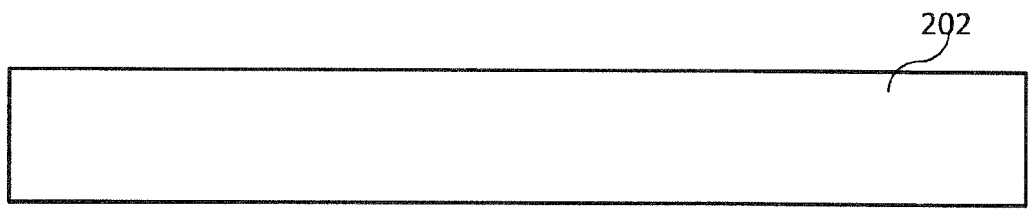
FIG. 2A schematically shows a cross section of a carrier at an initial processing stage in accordance with various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface or deposit a layer "over" a carrier, may be used herein to mean that the deposited material may be formed "directly on", e.g. in direct contact with, the implied side, surface, or carrier. The word "over" used with regards to a deposited material formed "over" a side or surface or to deposit a layer "over" a carrier, may be used herein to mean that the deposited material may be formed "indirectly on" the implied side, surface, or carrier with one or more additional layers being arranged between the implied side, surface, or carrier and the deposited material.

According to various embodiments, forming a layer (e.g. depositing a layer, e.g. depositing a material, e.g. a layering process) as described herein may also include forming a layer, wherein the layer may include various sub layers, whereby different sub layers may include different materials respectively. In other words, various different sub layers may be included in a layer, or various different regions may be included in a deposited layer or in a deposited material.

Since there may be many individual processes used in semiconductor processing (e.g. microchip fabrication), usually in sequence, several basic manufacturing techniques may be used at least once in the overall process. The following description of basic techniques should be understood as illustrating examples, which techniques may be included in processes described in the following. The basic techniques exemplarily described herein may be not necessarily need to be construed as preferred or advantageous over other techniques or methods, since they only serve to illustrate how the invention may be practiced. For sake of brevity the illustration of basic techniques exemplarily described herein is only a short overview and should not be considered as exhaustive specification.

According to various embodiments, the following basic techniques may be included in the method for processing a carrier, the method for fabricating a charge storage memory cell, the method for processing a chip, and the method for electrically contacting a spacer structure.

Layering is one of the techniques in semiconductor processing. In a layering process, a layer (also referred to as film or thin film) may be deposited over a surface (e.g. over a carrier, over a wafer, over a substrate, over another layer, or the like) using deposition techniques which may include chemical vapor deposition (CVD, or a CVD process) and physical vapor deposition (PVD, or a PVD process), according to various embodiments. According to various embodiments, the thickness of a deposited layer may be in the range of a few nanometers up to several micrometers depending on its specific function. Further, according to various embodiments, a layer may include at least one of an electrically insulating material, an electrically semiconducting material, and an electrically conductive material, depending on the respective specific function of the layer. According to various embodiments, conductive materials, as for example aluminium, aluminium-silicon alloys, aluminium-copper alloys, nichrome (an alloy of nickel, chromium, and/or iron), tungsten, titanium, molybdenum, or gold (or the like), may be deposited using CVD or PVD. According to various embodiments, semiconducting materials, as for example silicon, germanium, a semiconductor compound material such as gallium arsenide (GaAs), indium phosphide (InP), or indium gallium arsenide (InGaAs) may be deposited using CVD (e.g. epitaxially grown silicon or polycrystalline silicon (also referred to as polysilicon)). Insulating materials, as for example silicon oxide or silicon nitride (or the like) may be deposited using CVD or PVD. According to various embodiments, modifications of these processes may be used as described in the following.

According to various embodiments, a chemical vapor deposition process (CVD process) may include a variety of modifications, as for example atmospheric pressure CVD (APCVD), low pressure CVD (LPCVD), ultrahigh vacuum CVD (UHVCVD), plasma enhanced CVD (PECVD), high density plasma CVD (HDPCVD), remote plasma enhanced CVD (RPECVD), atomic layer CVD (ALCVD), vapor phase epitaxy (VPE), metal organic CVD (MOCVD), hybrid physical CVD (HPCVD), and the like. According to various embodiments, polysilicon, silicon dioxide, silicon nitride, and the like may be deposited using LPCVD, but also molybdenum, tantalum, titanium, nickel, tungsten, and the like may be deposited using LPCVD.

According to various embodiments, physical vapor deposition may include a variety of modifications, as for example magnetron sputtering, ion-beam sputtering (IBS), reactive sputtering, high-power impulse magnetron sputtering (HIPIMS), vacuum evaporation, molecular beam epitaxy (MBE), and the like.

According to various embodiments, a layering process may also include thermal oxidation (also referred to as thermal oxidation process). According to various embodiments, thermal oxidation may be used to grow high quality silicon oxide layers (so-called high temperature oxide layer (HTO)) on a silicon surface, e.g. at a temperatures in the range from about 800° C. to about 1200° C. The thermal oxidation may be performed at atmospheric pressure or at high pressure and as further development as a rapid thermal oxidation process (RTO). According to various embodiments, also thermal nitridation may be applied to generate high quality nitride or oxynitride layers (e.g. silicon nitride layers or silicon oxynitride layers), e.g. using rapid thermal nitridation (e.g. at temperatures up to about 1300° C.).

Further, according to various embodiments, a process which may be applied to generate a thin layer of a metal may be plating, e.g. electroplating or electroless plating.

It should be noted, that a variety of combinations of the materials and processes may be used within a layering process, according to various embodiments. Depending on specific aspects, as for example crystalline quality, surface roughness, edge covering behavior, growth speed, and yield, the most suitable process may be applied for the respective material, according to various embodiments.

According to various embodiments, some processes may require a conformally deposited thin film or a conformally deposited layer of a material (e.g. a spacer layer), which means that the film or the layer may exhibit only small thickness variations along the interface with another body, e.g. the film or the layer may exhibit only small thickness variations along edges, steps or other elements of the morphology of the interface. According to various embodiments, layering processes such as plating or several CVD processes (e.g. LPCVD) may be suitable to generate a conformal thin film or a conformally deposited layer of a material. With other words, a conformal deposition process may exhibit a high edge coverage.

Patterning is another technique in semiconductor processing. According to various embodiments, a patterning process may include removing selected portions of a surface layer or of a material. After a surface layer may be partially removed, a pattern (or a patterned layer or patterned surface layer) may remain over the underlying structure (e.g. a pattern may remain on a wafer). Since a plurality of processes may be involved, according to various embodiments, there are various possibilities to perform a patterning process, wherein aspects may be: selecting at least one portion of a surface layer (or a material) which shall be removed, e.g. using at least one lithographic process; and removing the selected portions of a surface layer, e.g. using at least one etch process.

According to various embodiments, a variety of lithographic processes may be applied generating a lithographic mask (a so-called photomask), as for example photolithography, microlithography or nanolithography, electron beam lithography, X-ray lithography, extreme ultraviolet lithography (EUV or EUVL), interference lithography, and the like. According to various embodiments, a lithographic process may include at least one of an initial cleaning process, a preparation process, applying a resist (e.g. a photoresist), exposing the resist (e.g. exposing the photoresist to a pattern of light), developing the resist (e.g. developing the photoresist using a chemical photoresist developer).

According to various embodiments, an initial cleaning process or a cleaning process, which may be included in a lithographic process (or which may be included in a general process in semiconductor processing), may be applied to remove organic or inorganic contaminations (or material) from a surface (e.g. from a surface layer, from a carrier, from a wafer, and the like) by for example wet chemical treatment. According to various embodiments, the initial cleaning process or a cleaning process may include at least one of the following processes: RCA (Radio Corporation of America) cleaning (also known as Organic Clean (SC1) and Ionic Clean (SC2)); SCROD (single-wafer spin cleaning with repetitive use of ozonized water and diluted HF); IMEC wafer cleaning; post chemical mechanical polishing (post-CMP) cleaning process; cleaning via de-ionized water (DIW), piranha etch and/or a metal etch; (and the like).

According to various embodiments, a cleaning process may also be applied for removing a thin oxide layer (e.g. a thin silicon oxide layer) from a surface (e.g. from a surface layer, from a carrier, or from a wafer, and the like).

According to various embodiments, a preparation process, which may be included in a lithographic process, may be applied to promote the adhesion of the photoresist to a surface (e.g. to a surface layer, to a carrier, or to a wafer, and the like). According to various embodiments, the preparation process may include applying a liquid or gaseous adhesion promoter (e.g. bis(trimethylsilyl)amine (HMDS)).

According to various embodiments, a resist, which may be included in a lithographic process, may be applied to cover a surface (e.g. a surface layer, a carrier, or a wafer, and the like) homogeneously. According to various embodiments, applying a resist may include spin coating to generate a thin homogenous layer of the resist. Afterwards, a resist may be prebaked to drive off excess resist solvent, according to various embodiments. According to various embodiments, several types of resists (e.g. a photoresist) may be used adapted to the process of exposing the resist to achieve desired results. According to various embodiments, positive photoresists (e.g. DNQ-Novolac, PMMA, PMIPK, PBS, and the like) may be used, whereby the resist that has been exposed to light becomes soluble to a photoresist developer, and/or negative photoresists (e.g. SU-8, poly isoprene, COP, and the like) may be used, whereby the resist that has been exposed to light becomes insoluble to a photoresist developer.

According to various embodiments, a resist may be exposed (e.g. exposing the photoresist to a pattern of light), which may be included in a lithographic process, to transfer a desired pattern to a resist, e.g. using light or electrons, wherein the desired pattern may be defined by a pattered mask (e.g. a glass carrier with a patterned chromium layer). According to various embodiments, mask-less lithography may be applied, wherein a precise beam (e.g. an electron beam or a laser beam) may be projected without using a mask directly onto the surface including the resist. According to various embodiments, the exposure to light may cause a reaction in the resist that may allow that some of the resist may be removed by a special solution (a so-called developer, e.g. a photoresist developer). Since the resolution of an optical imaging process is limited by the used wavelength, the wavelength of the used light may range from the wavelength of the visible light to a smaller wavelength in the ultra violet range, according to various embodiments. According to various embodiments, the exposure may be performed using x-rays or electrons having even a shorter wavelength than ultra violet light. According to various embodiments, projection exposure systems (steppers or scanners) may be used projecting the mask many times onto a surface including a resist to create the complete exposure pattern.

According to various embodiments, a resist may be developed (e.g. developing the photoresist using a photoresist developer), which may be included in a lithographic process, to partially remove the resist generating a patterned resist layer remaining on the surface (e.g. on a surface layer or on a carrier, a wafer, and the like). According to various embodiments, developing a resist may include a post exposure bake (a heat treatment, e.g. rapid thermal processing) before the actual developing process may be performed. According to various embodiments, the developing process may include a special chemical solution (a so-called developer) as for example sodium hydroxide or tetramethylammonium hydroxide (TMAH, a metal ion free developer).

According to various embodiments, the remaining patterned resist may be solidified in a hard bake process (a heat treatment, e.g. rapid thermal processing), realizing a more durable protecting layer for later processes as for example ion implantation, wet chemical etching, or plasma etching (and the like).

Independently from the described lithographic processes, a resist may be removed completely at a desired processing stage (e.g. after at least one of an etch process, ion implantation process, and a deposition process have been performed) in a so-called resist strip process. According to various embodiments, a resist may be removed chemically and/or by using oxygen plasma.

It should be noted, that a lithographic process, according to various embodiments, including applying a resist, exposing a resist and developing a resist may also be considered as a patterning process, wherein a patterned resist layer (a soft mask, or a resist mask) may be generated by the lithographic process. Further, according to various embodiments, subsequently using an etch process a pattern can be transferred from a patterned resist layer to a prior deposited or grown layer (or a carrier, and the like), wherein the previously deposited or grown layer may include a hard mask material as for example an oxide or a nitride (e.g. silicon oxide, e.g. silicon nitride) creating a so-called hard mask.

According to various embodiments, an etch process, which may be included in a patterning process, may be applied to remove material from a prior deposited layer, a grown surface layer, a carrier (or substrate, or wafer), and the like. According to various embodiments, an etch process may be performed depending on the specific requirements for this process. According to various embodiments, an etch process may be selective or non-selective with respect to a specific material. According to various embodiments, an etch process may be isotropic or anisotropic, wherein an anisotropic etch process (e.g. a wet etch process) may reveal a different etching rate along a respective crystallographic direction of a specific material or wherein an anisotropic etch process (e.g. a dry etch process) may reveal a different etching rate for surfaces with a specific geometric alignment.

According to various embodiments, a dry etch process may be applied, as for example plasma etching, ion beam milling, or reactive ion etching (RIE).

Plasma etching generates charged ions, neutral atoms and/or radicals. During the plasma etch process the chemical reactions between the elements of the etched material and the reactive species generated by the plasma may generate volatile etch products (e.g. etch products being volatile at room temperature). Therefore, according to various embodiments, a plasma etch process may be isotropic and may be highly selective, partially selective, or non-selective depending on the used gaseous plasma etchants and the involved materials. According to various embodiments, silicon may be etched using plasma etchants like $CF_4$, $SF_6$, $NF_3$, or $Cl_2$ and silicon dioxide may be etched using plasma etchants like $CF_4$, $SF_6$, $NF_3$, and as an exemplary result, the plasma etch process may be selective to silicon (e.g. using $Cl_2$ as plasma etchant) and the plasma etch process may be non-selective to silicon and silicon dioxide (e.g. using $CF_4$, $SF_6$, $NF_3$ as plasma etchants). According to various embodiments, the plasma etch process may be selective to silicon dioxide. According to various embodiments, the plasma etch process may be selective to silicon.

According to various embodiments, a physical etch process may be applied (e.g. ion beam milling or sputter etching), wherein a material is bombarded with energetic ions of noble gases (e.g. argon ions), wherein atoms are removed from the bombarded material by the transferred momentum. According to various embodiments, the ions may approach a material approximately from one direction, and therefore, ion beam milling may be highly anisotropic and as there may be no chemical reaction involved ion milling tends to be non-selective.

According to various embodiments, a reactive ion etching (RIE) process may be applied. According to various embodiments, the ions may chemically react with a material, but can also remove atoms from the surface of a material by the transferred momentum (sputtering). Depending on the plasma etchants and the involved materials, RIE may be configured to be selective or non-selective to specific materials. According to various embodiments, due to the mostly vertical delivery of reactive ions, reactive ion etching may be configured to be an anisotropic etch process. The etch conditions in an RIE system may depend on process parameters like pressure, gas flow, and radio frequency (RF) power. Further, according to various embodiments, to create a deep penetration, steep-sided holes and trenches in a material (e.g. in a wafer, in a substrate, in a deposited or grown layer, and the like) deep reactive-ion etching (DRIE) may be applied. Deep reactive-ion etching is an anisotropic etch process, typically with high aspect ratios. According to various embodiments, a pulsed etching (time-multiplexed etching) may be applied. Pulsed etching is an anisotropic etch process, which may be used to create structure elements with high aspect ratios.

It should be noted that the anisotropy in a dry etch process may result from the anisotropic momentum of the ions (or atoms, or molecules). Therefore, in contrast to a wet etch process, the crystal structure may have a minor influence on the resulting etch structures using a dry etch process. Additionally, in contrast to wet etch processes, also polycrystalline materials (e.g. polysilicon) featuring randomly oriented crystallites can be etched anisotropically creating structures with high aspect ratios (ratio of width and height of a structure element), e.g. 1:10 or even greater, e.g. 1:50 or even greater.

According to various embodiments, a patterned layer may also serve as a mask for other processes like etching, ion implantation or layering (a so-called hard mask). Further, according to various embodiments, a patterned photoresist may also serve as a mask (a so-called soft mask). According to various embodiments, a soft mask may be used for a lift-of process. The mask material may usually be selected with regard to specific needs as for example chemical stability, e.g. to perform a selective etch process which does not affect the mask material (e.g. etching away the mask material completely), or mechanical stability, e.g. to protect regions from being penetrated by ions, or to define the shape of generated structure elements during a layering process, and the like.

Since the desired shapes and structure elements may be generated in their exact dimensions (feature size) during a patterning process, patterning may be the most critical process regarding the reduction of the feature size. Errors during a patterning process may cause a distorted pattern or a misplaced pattern and therefore may change the electrically functioning of a device or of an integrated circuit. Misplacement of a respective structure element, or part of a structure element, e.g. due to overlay errors, may have negative effects on the functionality of the structure element. Therefore, the patterning process may define a critical feature size. According to various embodiments, there may be several possibilities to lower the feature size, e.g. by using multiple patterning, multiple exposures, or using a spacer structure to minimize the critical feature size.

According to various embodiments, a doping process may be applied to change the physical properties of a material by adding dopant material, wherein the key aspects may be the electronic properties of the doped material (e.g. the specific electrical conductivity). According to various embodiments, various techniques may be applied or adapted to perform a doping process, as for example thermal diffusion and/or ion implantation. Doping, which may be performed in semiconductor processing, may serve to generate regions in a carrier (in a wafer, in a substrate, in a layer, and the like) being either rich in electrons (electron doping) or rich in holes (hole doping), wherein the electrons and holes may contribute to charge transport accordingly. Electron doping may be performed by implanting ions having more valence electrons than the solid state material (e.g. by implanting phosphor or arsenic into silicon) and hole doping may be performed by implanting ions having less valence electrons than the solid state material (e.g. by implanting boron into silicon). Doped regions in a carrier or substrate (and the like) may also be called pockets. Further, electron doped material may be called n-type (negative-type) and hole doped material may be called p-type (positive type). According to various embodiments, thermal diffusion and ion implantation may be used for doping a material.

According to various embodiments, in a thermal diffusion process, dopant material may be provided to diffuse into the material (e.g. a gaseous dopant material may be provided over or near a surface of a material), wherein the material may be heated up (e.g. to about 1000° C.) to support diffusion processes, according to various embodiments.

According to various embodiments, in an ion implantation process the penetration depth and the distribution of the implanted ions may depend on the stopping mechanism (the interaction of the ions with the solid state material) and may be varied by varying the kinetic energy of the ions. Other key parameters, which can be varied, may be the dose (or doping material concentration) and the angle between the surface of the solid state material and the propagation direction of the ions during an implantation process. According to various embodiments, after implanting ions a thermal annealing process (e.g. rapid thermal annealing) may be carried out to create homogenous doping regions and/or to recover the crystal structure from ion damages.

According to various embodiments, a heat treatment may be included at various points, e.g. in combination with a patterning process, as for example after an ion implantation process, after applying photoresist to expel solvents, or after depositing electrical contacts to alloy the electrically conductive material (e.g. a metal) with a carrier (e.g. a wafer, and the like), or to provide optimal deposition conditions for CVD processes (and the like). According to various embodiments, the heating of a carrier (a wafer, a substrate, and the like) may be performed with direct contact, e.g. a hot plate, or by radiation, e.g. using a laser or lamps. According to various embodiments, a rapid thermal processing (RTP) may be applied, which may be performed under vacuum conditions using a laser heater or lamp heater, wherein a material (e.g. a wafer, a substrate, a carrier, and the like) may be heated up to several hundred degree Celsius or up to about 1000° C. or even greater within a short time period, e.g. within several seconds (e.g. about 1 s to about 10 s). Subsets of rapid thermal processing are rapid thermal annealing (RTA) and rapid thermal oxidation (RTO).

According to various embodiments, a contact metallization process may be applied. A contact metallization process, wherein a metallization has direct contact with at least one structure element provided on a carrier (or on a substrate, a wafer, and the like), may realize required electrical connections (or interconnections) for the structure elements provided on a carrier (or on a substrate, a wafer, and the like). According to various embodiments, a contact metallization process may include at least one layering process and/or at least one patterning process. According to various embodiments, a contact metallization process may include depositing a layer of a dielectric material (e.g. a low-k dielectric material, e.g. undoped silicate glass, and the like), forming contact holes at the desired locations (e.g. using a patterning process) and filling the holes with at least one electrically conductive material (e.g. at least one of a metal (e.g. aluminium, copper, tungsten, titanium, molybdenum, gold, and the like), a metallic material (e.g. titanium nitride, platinum silicide, titanium silicide, tungsten silicide, molybdenum silicide, and the like), electrically conductive silicon (e.g. electrically conductive polysilicon), and a metal alloy (e.g. aluminium-silicon alloys, aluminium-copper alloys, aluminium-silicon-copper alloys, nichrome, titanium-tungsten alloys, and the like)) using a layering process. Further, according to various embodiments, a contact metallization process (or a metallization process) may include forming additional layers for example as a barrier (e.g. including at least one of molybdenum, platinum silicide, titanium silicide, tungsten silicide, molybdenum silicide, borides, and the like), or as adhesion promoter (e.g. including at least one of platinum silicide, titanium silicide, tungsten silicide, molybdenum silicide, and the like). Further, according to various embodiments, the formation of a silicide may be self-aligned.

Further, according to various embodiments, a metallization process may be applied to generate a single level metallization having one metal layer or a multilevel metallization including a plurality of metal layers after the contact metallization may be provided. According to various embodiments, a metallization process may include at least one layering process and may include at least one patterning process. According to various embodiments, a metallization process or a contact metallization process may include a lift-off process, after having deposited the electrically conductive material over a soft mask, wherein the soft mask may be removed and thereby the electrically conductive material deposited over the soft mask may be removed as well.

According to various embodiments, applying a metallization process may further include a planarization of the carrier surface (wafer surface, substrate surface, and the like) and/or a planarization of intermediate layers included in a multilevel metallization process (e.g. using chemical mechanical polishing).

According to various embodiments, a planarization process may be applied as for example to reduce the surface roughness or the reduced variations in the depth profile of a carrier or a wafer surface including structure elements having different heights, since some processes may require a flat surface (a planar surface) (e.g. high resolution lithography). According to various embodiments, a planarization process may be necessary as the number of performed layering processes and patterning processes increases and as a planar surface may be required. According to various embodiments, a chemical mechanical polishing process (CMP or CMP process) may be performed, wherein this process may be selective to specific materials on the surface of a carrier (of a wafer, substrate, surface layer, and the like). According to various embodiments, a chemical mechanical polishing process (CMP) may be performed, wherein this process may be non-selective to specific materials on the surface of a carrier (of a wafer, substrate, surface layer, and the like). According to various embodiments, a planarization process may be included additionally in several processes, e.g. in layering processes, patterning processes, and the like.

According to various embodiments, a spacer structure may be formed, a so-called sidewall spacer or spacer. A spacer structure (or sidewall spacer or spacer, as referred to herein) may be formed on at least one sidewall of at least one structure element provided over a carrier (over a wafer, over a substrate, and the like) by using at least one conformal deposition process and subsequently at least one anisotropic etch process. According to various embodiments, the sidewalls of the respective structure elements, where a sidewall spacer shall be formed, may be at least approximately perpendicular to the surface of a carrier (of a wafer, substrate, surface layer, and the like). According to various embodiments, the spacer structure may be formed by depositing a conformal layer of a spacer material over at least part of a structure element including at least one sidewall of the at least one structure element. As a result, a layer of spacer material may be formed having the same thickness at all surfaces of the involved structures, wherein the involved structures may be at least part of the surface of a carrier, at least one sidewall of at least one structure element, and at least part of the upper surface of the at least one structure element. Afterwards, an anisotropic etch process may be performed partially removing the spacer material, according to various embodiments. Due to the anisotropic etch process, the spacer material on surfaces aligned at least approximately parallel to the surface of the carrier as well as the spacer material directly on the carrier (more precisely spacer material directly on the carrier not being contiguous to the structure elements) may be removed completely, whereas spacer material may remain on the at least one sidewall of the at least one structure element. Remaining spacer material on a sidewall of a structure element may be referred to as sidewall spacer.

According to various embodiments, forming a spacer structure may include at least one of the following additional processes: an additional layering process, an additional patterning process, an additional cleaning process, and an additional planarization process. According to various embodiments the spacer material may be electrically conductive and may include at least one material of the following group of materials: silicon (e.g. electrically conductive silicon, e.g. doped polysilicon), a metal (e.g. aluminium, copper, tungsten, titanium, molybdenum, gold, and the like), metallic materials (e.g. titanium nitride), and metal alloys (e.g. aluminium-silicon alloys, aluminium-copper alloys, nichrome, (and the like).

According to various embodiments, the carrier (e.g. a substrate, a wafer, and the like) may be made of semiconductor materials of various types, including silicon, germanium, Group III to V or other types, including polymers, for example, although in another embodiment, other suitable materials can also be used. In an embodiment, the wafer substrate is made of silicon (doped or undoped), in an alternative embodiment, the wafer substrate is a silicon on insulator (SOI) wafer. As an alternative, any other suitable semiconductor materials can be used for the wafer substrate, for example semiconductor compound material such as gallium arsenide (GaAs), indium phosphide (InP), but also any suitable ternary semiconductor compound material or quaternary semiconductor compound material such as indium gallium arsenide (InGaAs).

According to various embodiments, FIG. 1 shows in a flow diagram a method 100 for processing a carrier, wherein the method for processing a carrier may include, in 110, forming a structure over the carrier, wherein the structure may include at least two adjacent structure elements arranged at a first distance between the same; in 120, depositing a spacer layer over the structure, wherein the spacer layer may be deposited having a thickness greater than half of the first distance, wherein the spacer layer may include electrically conductive spacer material; in 130, removing a portion of the spacer layer, wherein spacer material of the spacer layer may remain in a region between the at least two adjacent structure elements; and in 140, electrically contacting the remaining spacer material.

FIG. 2A schematically shows a cross section of a carrier 202 at an initial processing stage in accordance with various embodiments.

Figure 2B:
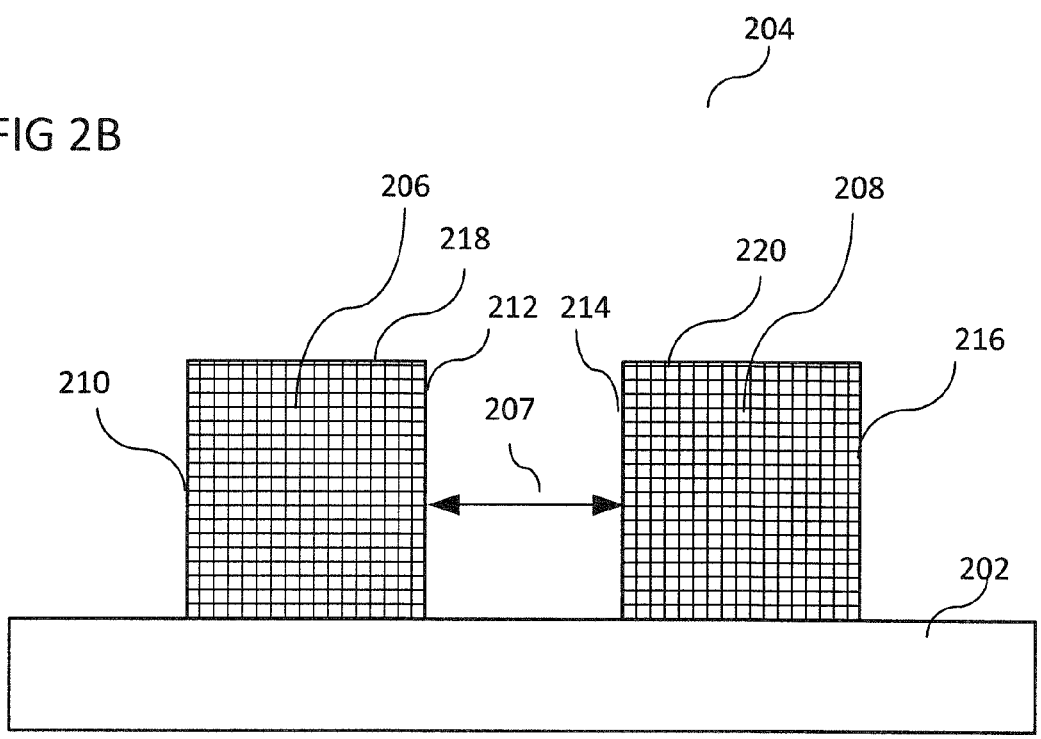
FIG. 2B schematically shows a cross section of the carrier and a corresponding structure formed over the carrier at a first processing stage in accordance with various embodiments.

As described above with reference to method 100, a structure may be formed over the carrier 202 in a first process 110, wherein the structure may include at least two adjacent structure elements arranged at a first distance between the same, according to various embodiments. FIG. 2B schematically shows a cross section of the carrier 202 and a corresponding structure 204 at a first processing stage, wherein a structure 204 may be formed over the carrier 202, in accordance with various embodiments. As shown in FIG. 2B, the structure 204 may be formed over the carrier 202 including two adjacent structure elements 206, 208 having a first distance 207 between the two adjacent structure elements 206, 208. The structure 204 as shown in FIG. 2B exhibits a first sidewall 210, a second sidewall 212, a third sidewall 214, and a fourth sidewall 216, wherein due to the symmetry, the sidewalls may be identical. Further, the structure 204 exhibits a first surface 218 and a second surface 220. The assignment first, second, third and fourth sidewalls, as well as first and second surfaces, may be chosen arbitrarily.

According to various embodiments, the first sidewall 214, the second sidewall 212, the third sidewall 214, and the fourth sidewall 216 may run parallel to each other, or may have a small deviance from being parallel, and may be aligned perpendicular to the surface of the carrier 202, or may have a small deviance from being perpendicular to the surface of the carrier 202. According to various embodiments, the cross section of the two adjacent structure elements 206, 208 may have a rectangular shape, or may have a small deviance from being in rectangular shape, as shown in FIG. 2B, whereby the first surface 218 of structure element 206 and the second surface 220 of structure element 208 may run parallel to the surface of the carrier 202, or may have a small deviance from being parallel to the surface of the carrier 202. A small deviance, as mentioned before, may be for example a deviance in the angular range from zero to five degree (e.g. 1° to 5°, e.g. 0.1° to 2°, or in a similar range). According to various embodiments, the base area of the structure elements may have a circular, rectangular, quadratic, elliptical, or triangular shape, or any other suitable shape. According to various embodiments, referring to the shapes of the base area and the shape of the cross section of a structure element, a structure element may be, with the exception of some minor differences, for example a right prism, a right circular cylinder, a right elliptical cylinder, or a right cylinder with an arbitrarily shaped base area. According to various embodiments, all structure elements forming the structure 204 may have the same shape. According to various embodiments, the structure elements forming the structure 204 may have various shapes. According to various embodiments, at least one selected structure element may have a different shape than the other structure element(s).

According to various embodiments, the structure elements may be formed using one or more of the above described techniques in semiconductor processing, as for example layering and patterning.

Figure 2C:
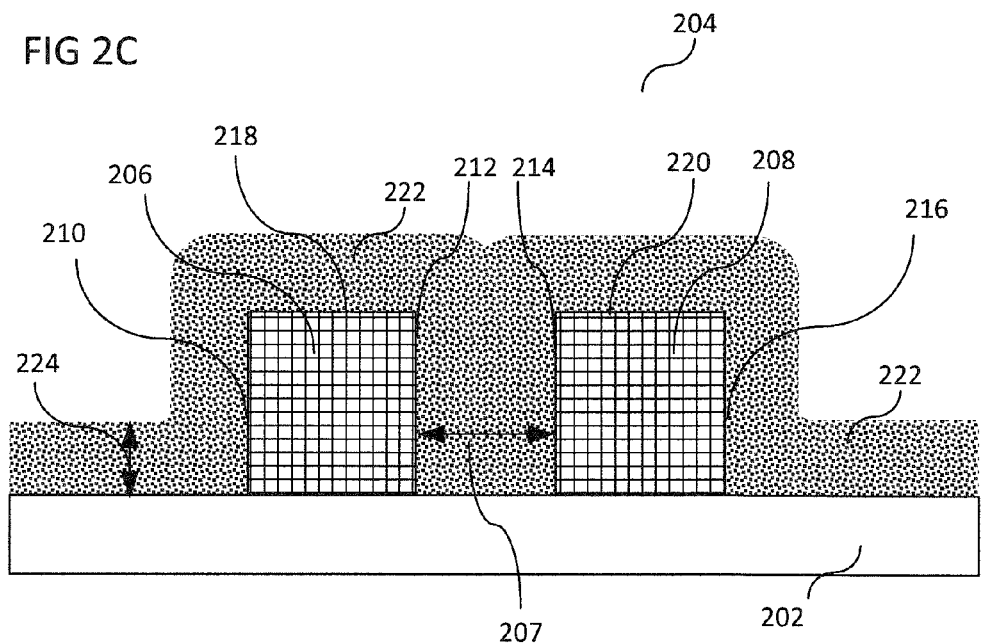
FIG. 2C schematically shows a cross section of the carrier and the corresponding structure at a second processing stage, wherein a spacer layer is formed over the carrier and the corresponding structure, in accordance with various embodiments.

As described above with reference to method 100, a spacer layer may be deposited over the carrier 202 in a process 120, the spacer layer having a thickness greater than half of the first distance 207, wherein the spacer layer may include electrically conductive spacer material, according to various embodiments. FIG. 2C schematically shows a cross section of the carrier 202 and the corresponding structure 204 at a second processing stage, wherein a spacer layer 222 is formed. As shown in FIG. 2C, the spacer layer 222 may be formed, e.g. deposited, over the carrier covering the first sidewall 214, the second sidewall 212, the third sidewall 214, and the fourth sidewall 216 as well as the first surface 218 of structure element 206 and the second surface 220 of structure element 208. Since the thickness 224 of the spacer layer 222 is greater than half of the first distance 207, the region between the structure elements 206, 208 having the first distance 207 may be completely filled with spacer material, as shown in FIG. 2C, in accordance with various embodiments.

According to various embodiments, the spacer layer 222 may be a conformally deposited layer formed by a conformal deposition process (e.g. LPCVD, and the like), as already described. According to various embodiments, the spacer layer 222 may be formed including an electrically conductive material. Further, the spacer layer 222 may be formed including at least one material of the following group of materials: silicon (e.g. electrically conductive silicon, e.g. electrically conductive polysilicon), a metal (e.g. aluminium, copper, tungsten, titanium, molybdenum, gold, and the like), metallic materials (e.g. titanium nitride), and metal alloys (e.g. aluminium-silicon alloys, aluminium-copper alloys, nichrome, and the like).

Figure 2D:
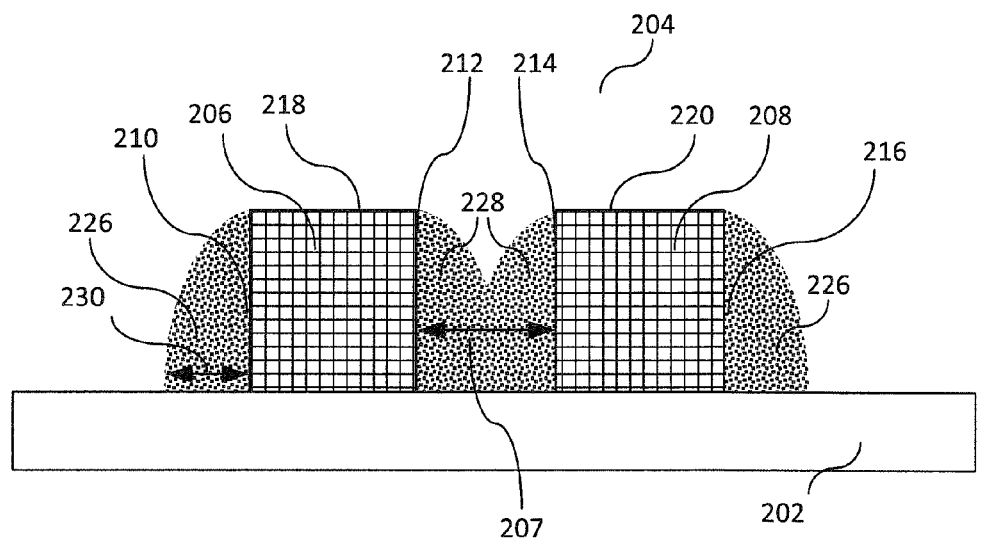
FIG. 2D schematically shows a cross section of the carrier and the corresponding structure at a third processing stage, wherein a portion of the spacer layer is removed, in accordance with various embodiments.

As described above with reference to method 100, a portion of the spacer layer may be removed in a third process 130, wherein spacer material of the spacer layer may remain in a region between the at least two adjacent structure elements, according to various embodiments. FIG. 2D schematically shows a cross section of the carrier 202 and the corresponding structure 204 at a third processing stage, wherein a portion of the spacer layer 222 may be removed. According to various embodiments, the spacer layer 222 may be partially removed using an anisotropic etch process (e.g. RIE), as already described. According to various embodiments, the anisotropic etch process may be selective to the spacer material to expose at least one surface of the structure elements, e.g. the first surface 218 of structure element 206 and the second surface 220 of structure element 208 as shown in FIG. 2D. Further, as depicted in FIG. 2D, after partially removing the spacer material, a portion of the spacer material may remain at the first sidewall 210 and at the fourth sidewall 216, forming a sidewall spacer 226 respectively, and a remaining spacer 228 may remain between structure element 206 and structure element 208. The width of the remaining spacer 228 is correlated with the first distance 207, as shown in FIG. 2D, whereas the width of the sidewall spacers 226 may be smaller.

As described above with reference to method 100, the remaining spacer 228 may be electrically contacted in a fourth process 140. According to various embodiments, electrically contacting the remaining spacer 228 may include a contact metallization process.

Figure 2E:
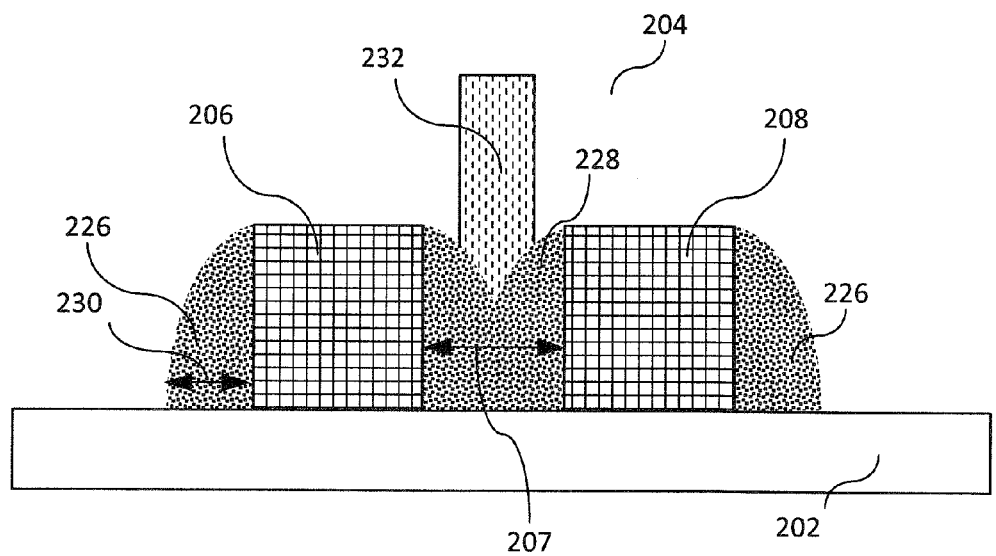
FIG. 2E schematically shows a cross section of the carrier and the corresponding structure at a fourth processing stage, wherein the remaining spacer is electrically contacted, in accordance with various embodiments.

FIG. 2E schematically shows a cross section of the carrier 202 and the corresponding structure 204 at a fourth processing stage, wherein an electrical contact 232 may be formed electrically contacting the remaining spacer 228. According to various embodiments, electrically contacting the remaining spacer 228 may include forming an electrical contact 232 over the remaining spacer 228. According to various embodiments, forming the electrical contact 232 may include depositing a hard mask material (e.g. an oxide or a nitride, e.g. silicon oxide, e.g. silicon nitride, e.g. undoped silicate glass) over the carrier 202 and the structure 204 and subsequently patterning the hard mask material, e.g. using a lithographic process (e.g. including applying a resist, exposing a resist and developing a resist) and an etch process (e.g. a selective etch process, e.g. RIE) afterwards, to provide a patterned hard mask material layer (a hard mask) before depositing and patterning the electrically conductive material forming the electrical contact 232, as shown in FIG. 2F, wherein layer 234 may be a hard mask (a hard mask material layer).

Figure 2F:
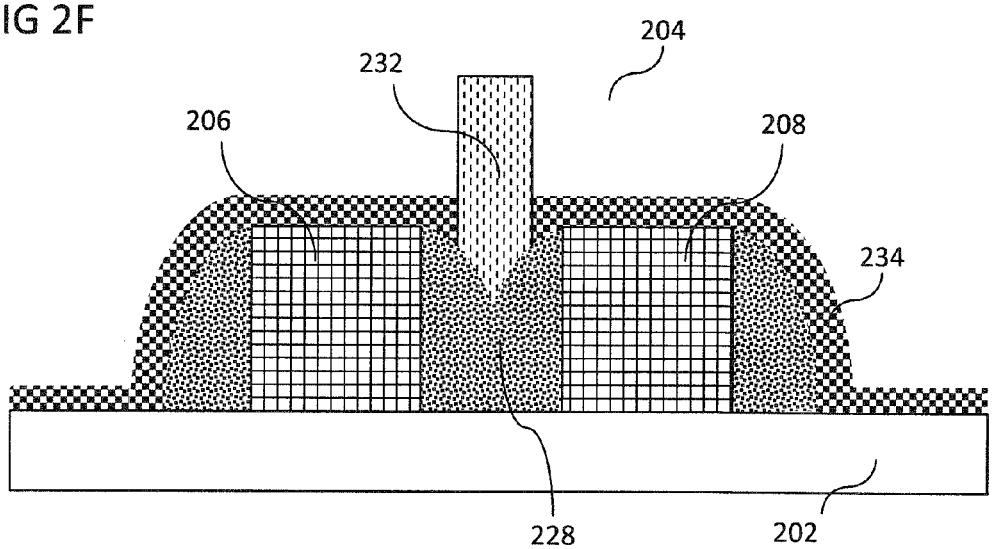
FIG. 2F schematically shows a cross section of the carrier and the corresponding structure, in accordance with various embodiments.

According to various embodiments, forming the electrical contact 232 may include at least one lithographic process (e.g. including applying a resist, exposing a resist and developing a resist) to provide a patterned resist layer (a resist mask or a soft mask,) before depositing and patterning the electrically conductive material forming the electrical contact 232, as shown exemplary in FIG. 2F, wherein layer 234 may be a soft mask. According to various embodiments, forming the electrical contact 232 may include a lift-off process (e.g. removing a soft mask), after having deposited the electrical conductive material over the soft mask.

According to various embodiments, forming the contact 232 may include a plurality of layers including various materials (e.g. at least one layer to improve the adhesion between an electrically conductive material and the remaining spacer 228, e.g. at least one layer as diffusion barrier, and the like). Further, according to various embodiments, the electrical contact 232 as shown in FIG. 2E may include at least one material of the following group of materials: a metal (e.g. aluminium, copper, tungsten, titanium, molybdenum, gold, and the like), metallic materials (e.g. titanium nitride, transition metal carbides), electrically conductive silicon (e.g. electrically conductive polysilicon), metal alloys (e.g. aluminium-silicon alloys, aluminium-copper alloys, nichrome), a silicide (titanium silicide, platinum silicide, tungsten silicide, cobalt silicide, nickel silicide), carbides, and the like). Further, according to various embodiments, the electrically conductive material of the electrical contact 232 may be deposited using CVD or PVD.

According to various embodiments, the remaining spacer 228 as well as the sidewall spacer 226 may be electrically isolated (e.g. by an additional isolating layer, e.g. by an additional oxide layer, e.g. by an additional silicon oxide layer) from the structure elements 206, 208. Further, according to various embodiments, the remaining spacer 228 as well as the sidewall spacer 226 may be electrically isolated (e.g. by an additional isolating layer, e.g. by an additional oxide layer, e.g. by an additional silicon oxide layer) from the carrier 202.

According to various embodiments, modifications, extensions, and details referring to the described method 100, as shown in FIG. 1 and exemplified in FIG. 2A to FIG. 2F and the accompanying description, are shown in the following. Referring to method 100, in various embodiments, a structure may be formed over a carrier (e.g. over carrier 202), wherein the structure (e.g. structure 204 as shown in FIG. 2B) may include at least two adjacent structure elements (e.g. structure elements 206 and 208, as shown in FIG. 2B) arranged at a first distance (e.g. first distance 207) between the same. According to various embodiments, at least one structure element of the at least two adjacent structure elements (e.g. structure elements 206 and 208 as shown in FIG. 2B) may form a layer stack, wherein the layer stack may be part of a field effect transistor (e.g. at least part of a metal-oxide-semiconductor field-effect transistor). In other words, at least one structure element included in the structure (e.g. structure 204 as shown in FIG. 2B) may form a part of a field-effect transistor (e.g. a part of a MOSFET). According to various embodiments, at least one structure element of the at least two adjacent structure elements (e.g. structure elements 206 and 208 as shown in FIG. 2B) may form a layer stack, wherein the layer stack may be at least a part of a charge storage memory cell (e.g. at least a part of a field-effect transistor including a charge storage layer). According to various embodiments, the layer stack may include at least one electrically isolating layer and at least one electrically conductive layer. According to various embodiments, a structure element including a layer stack, wherein the layer stack may be at least a part of a charge storage memory cell (e.g. at least a part of a field-effect transistor including a charge storage layer) is also referred to as a charge storage memory cell structure element.

Figure 3A:
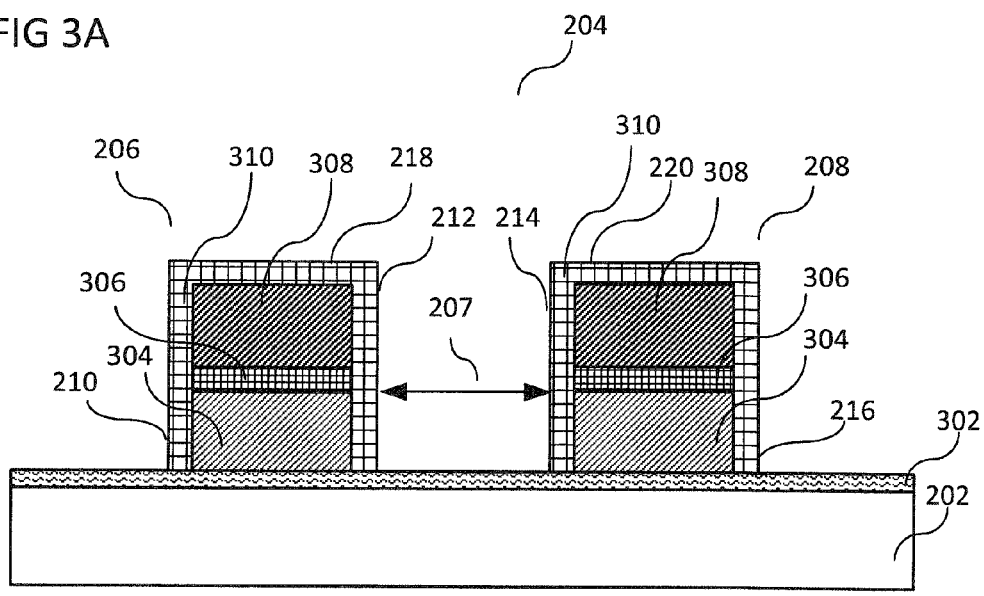
FIG. 3A schematically shows a cross section of the carrier and a corresponding structure formed over the carrier at an intermediate processing stage, in accordance with various embodiments.

As shown in FIG. 3A, at least one structure element, e.g. structure elements 206 and 208, may include a layer stack and the layer stack may be electrically isolated from the carrier 202 by a first insulating (electrically isolating) layer 302. According to various embodiments, first insulating layer 302 may be formed over carrier 202 by a layering process using for example thermal oxidation of the carrier 202 (e.g. thermal oxidation of a silicon wafer resulting in a silicon oxide layer over the silicon wafer). According to various embodiments, the first insulating layer 302 may be formed completely over the surface of the carrier 202 or over a portion of the carrier 202 in a layering process. Further, according to various embodiments, the material forming the first insulating layer 302 may include at least one of the following materials or a sub layer stack including a plurality of sub layers each having at least one of the following materials: electrical isolators as for example insulating oxides (e.g. silicon oxide or aluminium oxide), insulating nitrides (e.g. silicon nitride), insulating oxynitrides (silicon oxynitride, aluminium oxynitride, and the like. According to various embodiments, the layer stack may be a part of a charge storage memory cell (e.g. at least a part of a field-effect transistor including a charge storage layer). As shown in FIG. 3A, the layer stack may include a charge storage layer 304 (e.g. a floating gate or a charge trapping layer) formed over first insulating layer 302, a second insulating layer 306 formed over the charge storage layer 304, a control gate layer 308 (e.g. a control gate) formed over second insulating layer 306, and a third insulating layer 310 completely covering the underlying structure, according to various embodiments.

Further, according to various embodiments, the charge storage layer 304 arranged over the first insulating layer 302 may be formed using a layering process and optionally a patterning process as described before. In accordance with various embodiments, the charge storage layer 304 may be configured as a floating gate layer, e.g. by depositing a layer of doped silicon (e.g. doped polysilicon) over the first insulating layer 302. In accordance with an alternative embodiment, the charge storage layer 304 may be configured as a charge trapping layer, e.g. by depositing a nitride layer over first insulating layer 302 which may be part of an oxide-nitride-oxide (ONO) layer stack. According to various embodiments, the charge storage layer 304 may be a layer of nanocrystalline material, e.g. nanocrystalline silicon.

According to various embodiments, the second insulating layer 306 arranged over the charge storage layer 304 may be formed using a layering process and optionally a patterning process as described before. Further, the material forming the second insulating layer 306 may include at least one material of the following group of materials or a sub layer stack including a plurality of sub layers each having at least one material of the following group of materials: electrical isolators, e.g. insulating oxides (e.g. silicon oxide or aluminium oxide), insulating nitrides (e.g. silicon nitride), insulating oxynitrides (silicon oxynitride, aluminium oxynitride), and the like.

According to various embodiments, the control gate layer 308 may subsequently be formed over the second insulating layer 306 using a layering process and optionally a patterning process as described before. According to various embodiments, the control gate layer 308 may include electrically conductive material (e.g. doped silicon (e.g. doped polysilicon), and the like).

Figure 3B:
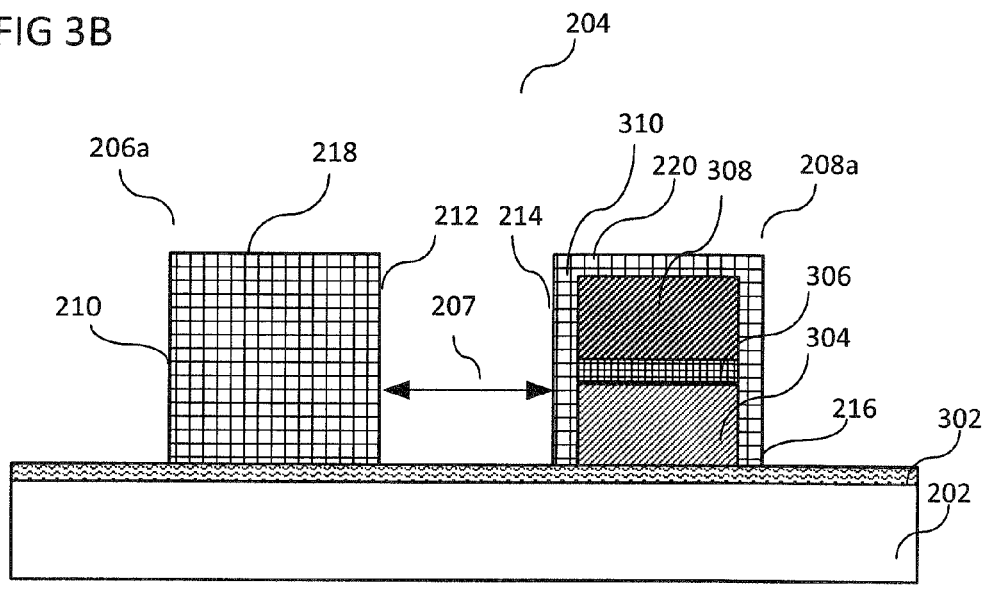
FIG. 3B schematically shows a cross section of the carrier and a corresponding structure formed over the carrier at an intermediate processing stage, in accordance with various embodiments.

Further, according to various embodiments, the charge storage layer 304 and the control gate layer 308 as well as second insulating layer 306 may be covered with insulating material forming third insulating layer 310 (e.g. using a layering process providing a sufficiently high edge coverage (e.g. ALD, LPCVD) and optionally a patterning process), resulting in the layer stack (e.g. structure elements 206 and 208 as shown in FIG. 3A or structure element 208a as shown in FIG. 3B). Further, according to various embodiments, the insulating material forming the third insulating layer 310 may include at least one of the following materials: electrical isolators, e.g. insulating oxides (e.g. silicon oxide or aluminium oxide), insulating nitrides (e.g. silicon nitride), insulating oxynitrides (silicon oxynitride, aluminium oxynitride), and the like.

According to various embodiments, the third insulating layer 310 (e.g. an oxide layer) may serve to insulate select structures (select gates, sidewall spacer), to be formed later (cf. FIG. 3C), from the layer stack. According to various embodiments, third insulating layer 310 may also at least partially cover the surface of the substrate 202 adjacent to the layer stack, or may cover at least partially the carrier 202, and accordingly at least partially the first insulating layer 302 as well (not shown in the Figures).

According to various embodiments, forming the charge storage layer 304, the control gate layer 308, and insulating layers 302, 306, 310 and therefore also forming the layer stack may include, without limitation, patterning processes and layering processes. According to various embodiments, the layer stack may be formed over a region of the carrier 202 using at least one layering process and may be subsequently patterned generating the structure elements as for example shown in FIG. 2B and FIG. 3A.

According to various embodiments, the first insulating layer 302 may, for example, have a thickness in the range from about 5 nm to about 15 nm, e.g. a thickness in the range from about 7 nm to about 13 nm, for example about 10 nm in one embodiment.

According to various embodiments, the charge storage layer 304 may, for example, have a thickness in the range from about 50 nm to about 150 nm, e.g. a thickness in the range from about 75 nm to about 125 nm, for example about 80 nm.

According to various embodiments, the second insulating layer 306 may, for example, have a thickness in the range from about 10 nm to about 20 nm, e.g. from about 12 nm to about 18 nm, for example about 14 nm.

According to various embodiments, the control gate layer 308 may, for example, have a thickness in the range from about 50 nm to about 150 nm, e.g. from about 75 nm to about 125 nm, for example about 100 nm.

According to various embodiments, the third insulating layer 310 may, for example, have a thickness in the range from about 15 nm to about 25 nm, e.g. in the range from about 17 nm to about 21 nm, for example about 19 nm in one embodiment.

According to various embodiments, the charge storage layer 304 (floating gate layer) and the control gate layer 308 may be provided by layers of silicon, e.g. electrically conducting polycrystalline silicon, which results in a so-called double poly stack.

According to various embodiments, at least one of the structure elements may be a dummy structure having no electrical functionality as exemplarily shown in FIG. 3B, wherein structure element 206a may serve as a dummy structure and structure element 208a may provide part of an integrated circuit having electrical functionality (e.g. structure element 208a may provide at least part of a transistor or provide at least part of a charge storage memory cell). According to this, the structure or the design of the dummy structure (e.g. structure element 206a) may be arbitrary, since the dummy structure may not have an electrical functionality, but, according to various embodiments, a crucial prerequisite may be, that the dummy structure elements and the according adjacent structure elements may have the first distance 207 between the corresponding adjacent sidewalls of the structure elements (e.g. between the sidewall 212 of the dummy structure element 206a and the sidewall 214 of the structure element 208a, as shown in FIG. 3B).

It should be noted, that, according to various embodiments, a structure element (e.g. structure element 206) which may serve as a dummy structure may be identical to a structure element having an electrical functionality (e.g. structure element 208).

Figure 3C:
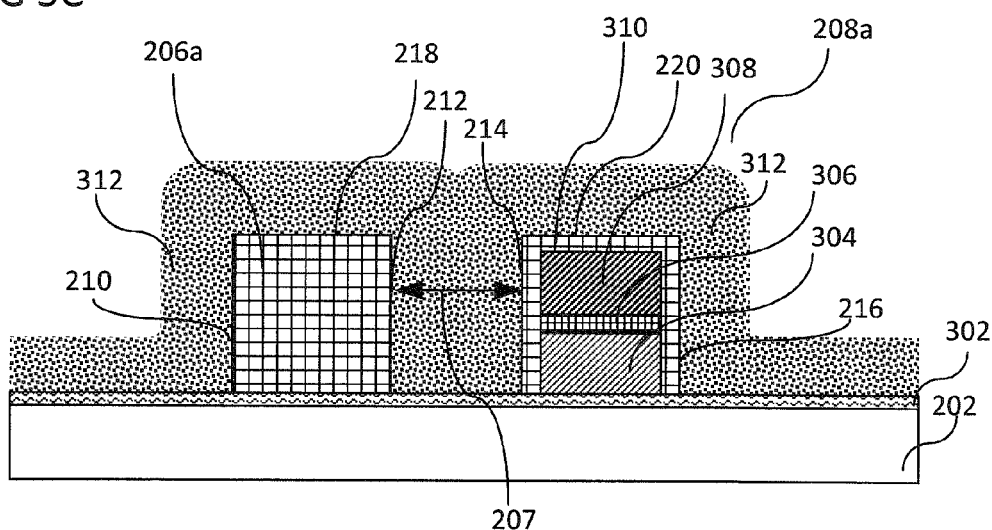
FIG. 3C schematically shows a cross section of the carrier and the corresponding structure at a processing stage, wherein a spacer layer is formed over the carrier and the corresponding structure, in accordance with various embodiments.

Referring to method 100, in various embodiments, after having formed the structure over the carrier (e.g. structure 204 as shown in FIG. 3A or FIG. 3B), wherein the structure may include at least two adjacent structure elements arranged at a first distance 207 between the same, wherein at least one of the structure elements may form a layer stack (e.g. 208a), wherein the layer stack may be at least a part of a charge storage memory cell, a spacer layer may be deposited over the structure, wherein the spacer layer may be deposited having a thickness greater than half of the first distance 207. As shown in FIG. 3C, a spacer layer 312 may be formed over the structure elements 206a and 208a, wherein at least one structure element may include a layer stack (e.g. a double poly stack). According to various embodiments, the spacer layer 312 may be formed using at least one layering process, as already described. According to various embodiments, the spacer layer 312 may be formed using at least one layering process and at least one patterning process, as already described. Further, according to various embodiments, the spacer layer 312 may include at least one electrically conductive spacer material including at least one of the following materials: silicon (electrically conductive silicon (e.g. doped polysilicon)), a metal (e.g. aluminium, copper, tungsten, titanium, molybdenum, gold, and the like), metallic materials (e.g. titanium nitride), and metal alloys (e.g. aluminium-silicon alloys, aluminium-copper alloys, nichrome).

Figure 3D:
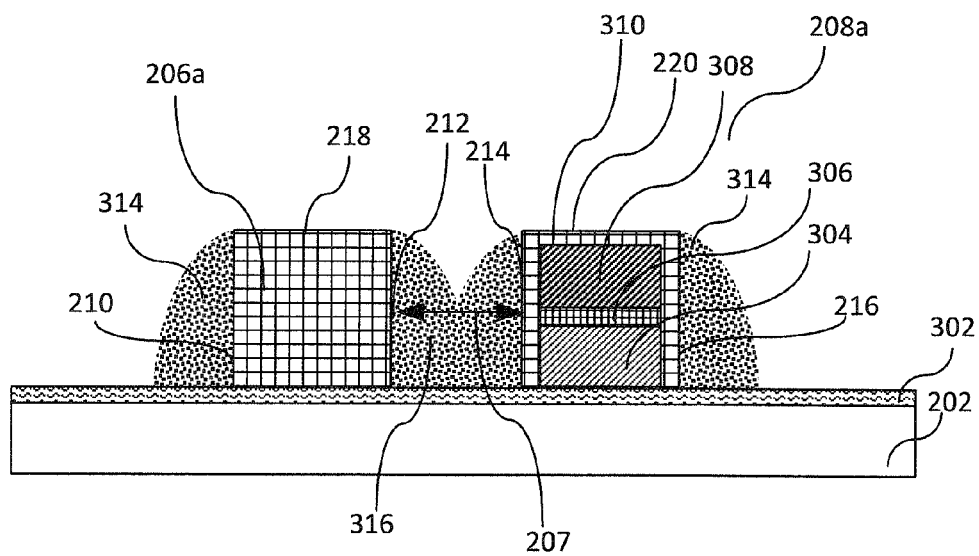
FIG. 3D schematically shows a cross section of the carrier and the corresponding structure at a processing stage, wherein a portion of the spacer layer is removed, in accordance with various embodiments.

Referring to method 100, in various embodiments, after having formed a structure over the carrier (e.g. structure 204 as shown in FIG. 3A or FIG. 3B), wherein the structure may including at least two adjacent structure elements arranged at a first distance 207 between the same, wherein at least one of the structure elements may form a layer stack (e.g. 208a), wherein the layer stack may be at least a part of a charge storage memory cell, and after having formed a spacer layer 312 over the structure, wherein the spacer layer may have a thickness greater than half of the first distance 207, a portion of the spacer layer 312 may be removed, wherein spacer material of the spacer layer 312 may remain in a region between the at least two adjacent structure elements (e.g. between 206a and 208a). According to various embodiments, the spacer layer 312 may be partially removed using an anisotropic etch process (e.g. RIE, and the like), as already described. According to various embodiments, the anisotropic etch process may be selective to the spacer material. According to various embodiments, the etch process may be performed exposing the surface of at least one structure element, e.g. the first surface 218 of structure element 206a and/or the second surface 220 of structure element 208a, as shown in FIG. 3D. Further, according to various embodiments, as depicted in FIG. 3D, after having partially removed spacer layer 312, spacer material may remain at the first sidewall 210 and at the fourth sidewall 216, forming a sidewall spacer 314 respectively, and a remaining spacer 316 may remain between structure element 206a and structure element 208a. The width of the remaining spacer 316 is correlated with the first distance 207, as shown in FIG. 3D, whereas the width of the sidewall spacers 314 may be significantly smaller. According to various embodiments, the sidewall spacer in contact with a dummy structure, e.g. structure element 206a as shown in FIG. 3D, may have no electrical function related to the integrated circuit, whereas the sidewall spacer in contact with a structure element, e.g. structure element 208a as shown in FIG. 3D, may have an electrical function related to the integrated circuit. According to various embodiments, the sidewall spacer in contact with a structure element having an electrical function, e.g. structure element 208a as shown in FIG. 3D, may be configured as a select gate for the structure element having an electrical function, e.g. a select gate included in a charge storage memory cell or a select gate included in a field effect transistor.

According to various embodiments, the remaining spacer between the at least two adjacent structure elements having a first distance 207, e.g. remaining spacer 316 between structure element 206a and structure element 208a, as shown in FIG. 3D, may provide a control line for at least one structure element, e.g. structure element 208a. According to various embodiments, if the structure element, e.g. structure element 208a, is at least a part of a field effect transistor, the remaining spacer between the at least two adjacent structure elements having a first distance 207, e.g. remaining spacer 316 between structure element 206a and structure element 208a, as shown in FIG. 3D, may provide a control line for at least one field effect transistor. According to various embodiments, if the structure element, e.g. structure element 208a, is at least a part of a field effect transistor, wherein at least a part of the field effect transistor may include a charge storage layer, e.g. charge storage layer 304, the remaining spacer between the at least two adjacent structure elements having a first distance 207, e.g. remaining spacer 316 between structure element 206a and structure element 208a, as shown in FIG. 3D, may provide a control line for at least one field effect transistor including a charge storage layer (e.g. the field effect transistor including a floating gate or a charge trapping layer). According to various embodiments, the control line for a field effect transistor, wherein the field effect transistor may include a charge storage layer, may be configured as a word line to address the field effect transistor, wherein the remaining spacer, e.g. remaining spacer 316 between structure element 206a and structure element 208a, may be configured as a select gate for at least one field effect transistor. According to various embodiments, the select gate may also be configured as an erase gate.

Figure 3E:
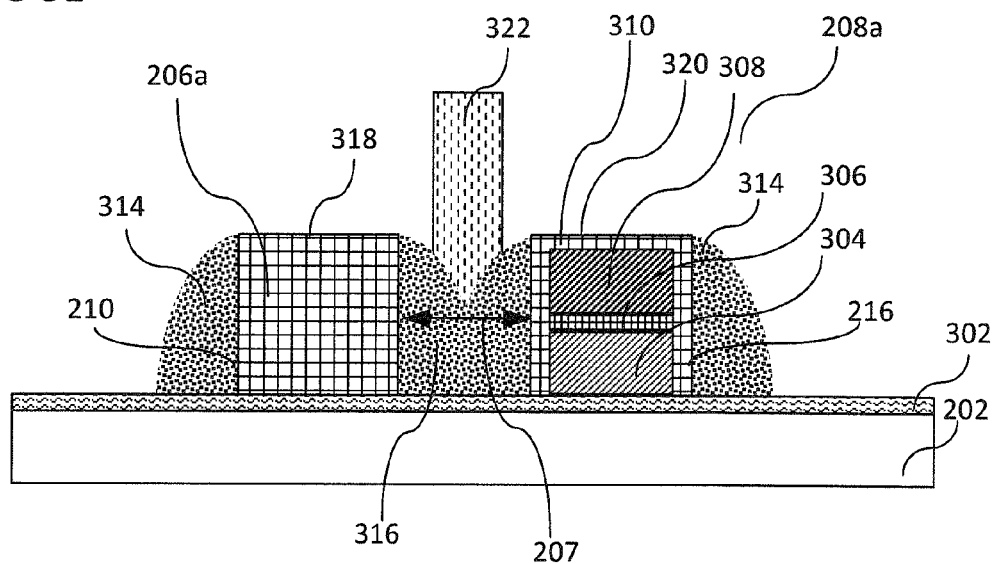
FIG. 3E schematically shows a cross section of the carrier and the corresponding structure at a processing stage, wherein the remaining spacer is electrically contacted, in accordance with various embodiments.

Referring to method 100, in various embodiments, after having formed a structure over the carrier (e.g. structure 204 as shown in FIG. 3A or FIG. 3B), wherein the structure may include at least two adjacent structure elements (e.g. structure elements 206 and 208, or 206a and 208a, as shown in FIG. 3A or FIG. 3B) arranged at a first distance (e.g. first distance 207) between the same, wherein at least one of the structure elements may form a layer stack (e.g. structure elements 206, 208, 208a as shown in FIG. 3A or FIG. 3B), wherein the layer stack may be at least a part of a charge storage memory cell, and after having formed a spacer layer (e.g. spacer layer 312 as shown in FIG. 3A or FIG. 3B) over the structure, wherein the spacer layer may have a thickness greater than half of the first distance, and after having removed a portion of the spacer layer, wherein spacer material of the spacer layer may remain in a region between the at least two adjacent structure elements, the remaining spacer material may be electrically contacted. According to various embodiments, the remaining spacer material may be electrically contacted using a contact metallization process, as described before. As shown in FIG. 3E, an electrical contact 322 may be formed over the remaining spacer 316 in analogy to process 140 as already described regarding method 100.

According to various embodiments, the spacer layer (e.g. spacer layer 222 and 312 as shown in FIG. 2C and FIG. 3C) may be formed at least partially over the structure (e.g. structure 204 as shown in FIG. 2B and FIG. 3A) using at least one layering process and at least one patterning process.

According to various embodiments, the structure elements (e.g. structure elements 206 and 208 as shown in FIG. 2B and FIG. 3A) may be formed at least partially over the carrier (e.g. carrier 202 as shown in FIG. 2B and FIG. 3A) using at least one layering process and at least one patterning process as described before.

According to various embodiments, the remaining spacer (e.g. remaining spacer 316, as shown in FIG. 3D) may provide a control line of a field-effect transistor (e.g. wherein the field-effect transistor may be partially represented be the layer stack, as described referring to method 100).

According to various embodiments, the sidewall spacer (e.g. sidewall spacer 314 contacting structure element 208a, as shown in FIG. 3D) may provide a control line of a field-effect transistor (e.g. wherein the field-effect transistor may be partially represented be a layer stack, as described referring to method 100).

According to various embodiments, the remaining spacer (e.g. remaining spacer 316, as shown in FIG. 3D) may provide a control line of a charge storage memory cell (e.g. wherein the charge storage memory cell may be partially represented be the layer stack, as shown and described in FIGS. 3A and 3B and the accompanying description referring to method 100).

According to various embodiments, the sidewall spacer (e.g. sidewall spacer 314 contacting structure element 208a, as shown in FIG. 3D) may provide a control line of a charge storage memory cell (e.g. wherein the charge storage memory cell may be partially represented be a layer stack, as shown and described in FIGS. 3A and 3B and the accompanying description referring to method 100).

According to various embodiments, the control line may be configured as a word line.

According to various embodiments, the control line may be configured to address an erase gate of at least one charge storing memory structure.

According to various embodiments, a doping process may be performed to provide at least one doped region in the carrier (e.g. in carrier 202). According to various embodiments, the at least one doped region may for example provide at least one source region, and/or at least one drain region, and/or a doped channel of at least one field effect transistor or at least one charge storage memory cell.

According to various embodiments, all structure elements forming a structure (e.g. structure 204) may have the same shape. According to various embodiments, the structure elements forming a structure (e.g. structure 204) may have various shapes. According to various embodiments, at least one selected structure element (e.g. structure element 206a) may have a different shape than the other structure elements (e.g. structure element 208a). According to various embodiments, at least one structure element (e.g. structure element 206a) may have a different shape and may be configured as a dummy structure, wherein the other structure elements (e.g. structure element 208a) may be configured as part of a charge storage memory cell.

According to various embodiments, an electrically conductive material (e.g. the material forming the contact 232) may include a plurality of layers including various materials (e.g. at least one layer to improve the adhesion between an electrically conductive material and the remaining spacer, e.g. at least one layer as diffusion barrier). According to various embodiments, an electrically conductive material (e.g. forming the spacer layer 222 or 312) may include a plurality of layers including various materials. Further, according to various embodiments, the electrically conductive material (e.g. forming the electrical contact 232 as shown in FIG. 2E) may include at least one material of the following group of materials: a metal (e.g. aluminium, copper, tungsten, titanium, molybdenum, gold, and the like), metallic materials (e.g. titanium nitride, transition metal carbides), electrically conductive silicon (e.g. doped polysilicon), metal alloys (e.g. aluminium-silicon alloys, aluminium-copper alloys, nichrome), a silicide (titanium silicide, platinum silicide, tungsten silicide, cobalt silicide, nickel silicide), carbides, and the like). Further, according to various embodiments, the electrically conductive material (e.g. forming the contact 232) may be deposited using CVD or PVD.

Using method 100, as described above, may result in a spacer structure which may be beneficial for generating electrical contacts. Since the remaining spacer between the at least two adjacent structure elements having a first distance (e.g. remaining spacer 228 between structure elements 206, 208 having a first distance 207 (c.f. FIG. 2E), e.g. remaining spacer 314 between structure elements 206a, 208a having a first distance 207 c.f. FIG. 3D) has a greater width than a sidewall spacer (e.g. sidewall spacer 226 c.f. FIG. 2E, e.g. sidewall spacer 314 c.f. FIG. 3D), forming the electrical contacts may be not affected by overlay errors occurring during generating the electrical contacts. Regarding to this, no additional process may be needed to generate a larger contact landing area, where the electrical contacts may be formed. In other words, if the contact landing area of the sidewall spacer (e.g. sidewall spacer 226) may be not large enough to enable a reliable electrical contact, e.g. because the area of the sidewall spacer may be not significantly larger than the contact area itself, so that overlay errors may play a dominating role for generating the electrical contact and the reliability of the electrical contact, then a larger contact landing area may be formed using method 100 without additional processes (e.g. additional patterning processes, or additional layering processes). The larger contact landing area may lead to more reliable structures without additional negative effects like increasing the number of involved processes and thereby without increasing costs, reducing the yield, reducing the reproducibility, or increasing the time for the fabrication of an electronic device. According to various embodiments, the method 100, as described herein, may be used to provide an electrical contact to a spacer structure. In other words the method 100, as described herein, may be used to provide a larger contact landing area enabling the electrical contacting of a structure element directly. The landing area generated by using method 100 as described herein is related to the distance between the two adjacent sidewalls of two adjacent structure elements (e.g. structure elements 206, 208 as shown in FIG. 2B or 206a, 208a as shown in FIG. 3B).

According to various embodiments, at least one of the structure elements (e.g. structure element 206a as shown in FIG. 3B) may be a dummy structure, which means that the dummy structure may not have an electrical functionality within an integrated circuit. In other words, at least one structure element (e.g. structure element 206a as shown in FIG. 3B) may only serve to create a remaining spacer (e.g. remaining spacer 316 as shown in FIG. 3D) between the at least two adjacent structure elements (e.g. structure elements 206a, 208a as shown in FIG. 3D), according to various embodiments.

According to various embodiments, the at least one dummy structure (e.g. structure element 206a as shown in FIG. 3B) may have a different shape than the other structure elements serving for the electrical functionality of the integrated circuit.

According to various embodiments, the at least one dummy structure (e.g. structure element 206a as shown in FIG. 3B) may be electrically isolated from the underlying structures (e.g. from the carrier 202).

According to various embodiments, at least one structure element may include a layer stack (e.g. structure element 208a as shown in FIG. 3B) forming at least part of a charge storage memory cell.

According to various embodiments, at least one structure element may include a layer stack forming at least part of a field effect transistor.

According to various embodiments, at least one spacer structure may be configured as a select gate.

According to various embodiments, forming a structure element may include, without limitation, patterning processes and layering processes in an arbitrary sequence. According to various embodiments, a structure may be formed over a region of a carrier using layering processes and may be subsequently patterned generating individual structure elements.

According to various embodiments, a structure element which may serve as a dummy structure may be identical to a structure element having an electrical functionality. Therefore, the dummy structure can be formed within the processes forming the structure elements having the desired electrical functionality in an integrated circuit. Thereby, the dummy structure may enable the manufacturing of a suitable landing area for electrical contacts without additional processes.

According to various embodiments, in the case that the two adjacent sidewalls of two adjacent structure elements (or two adjacent sidewalls of one structure element) may not run parallel to each other (but both sidewalls may be approximately perpendicular to the surface of the carrier), the two adjacent structure elements may have several distances between each other depending on the parts on the respective sidewalls being considered. However, in this case applying method 100 (e.g. process 120 and 130 as described before) may result in a remaining spacer structure, wherein spacer material remains in regions, where the distance between a first part of the first sidewall and a second part of the second sidewall is smaller than twice the spacer layer thickness deposited over the structure elements (in 120 as already described referring to method 100).

Figure 4:
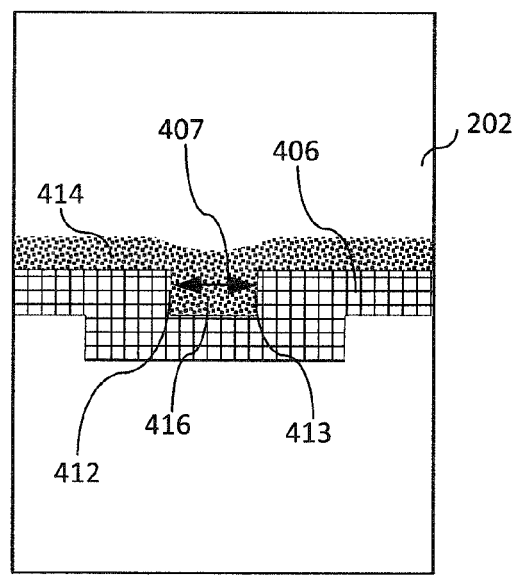
FIG. 4 schematically shows a top view of the carrier and a corresponding structure, wherein spacer material remains between two parts of the sidewall of a structure element, in accordance with various embodiments, FIG. 5 schematically shows a top view of the carrier including a plurality of structure elements, wherein the structure elements are formed in a U-shape and spacer material remains between at least two parts of a sidewall of a structure element respectively, in accordance with various embodiments.

According to various embodiments, the method 100 may also be performed in the following modification as exemplarily shown in FIG. 4 illustrating a top view of the carrier 202, wherein at least one structure element 406 is provided over the carrier 202. According to various embodiments, the at least one structure element 406 may be designed in such a shape, that parts 412, 413 of the sidewall of the at least one structure element 406 may have a first distance 407 in analogy to first distance 207 as described before. As can be seen in FIG. 4, according to an embodiment, the shape of the at least one structure element may be similar to a U-shape seen from the top view. According to various embodiments, other shapes may be suitable as well. According to various embodiments, applying method 100 including at least one structure element (e.g. structure element 406), wherein at least two parts of the at least one structure element (e.g. parts 412, 413 of the sidewall of the structure element 406) have a first distance 407, may result in the formation of a remaining spacer 416 between the at least two parts of the at least one structure element and a sidewall spacer 414, in analogy to method 100 as already described.

In analogy to the exemplary embodiment shown in FIG. 4 (illustrated in a top view), modifications can be made regarding the shape of the structure elements and the alignment of the structure elements. According to various embodiments, a layout for an electronic structure (e.g. a layout for a charge storage memory cell arrangement on a carrier) may be designed in such a way, that applying method 100 may result in the formation of a remaining spacer between at least two sidewalls of at least one structure element, in analogy to method 100 as already described.

Figure 5:
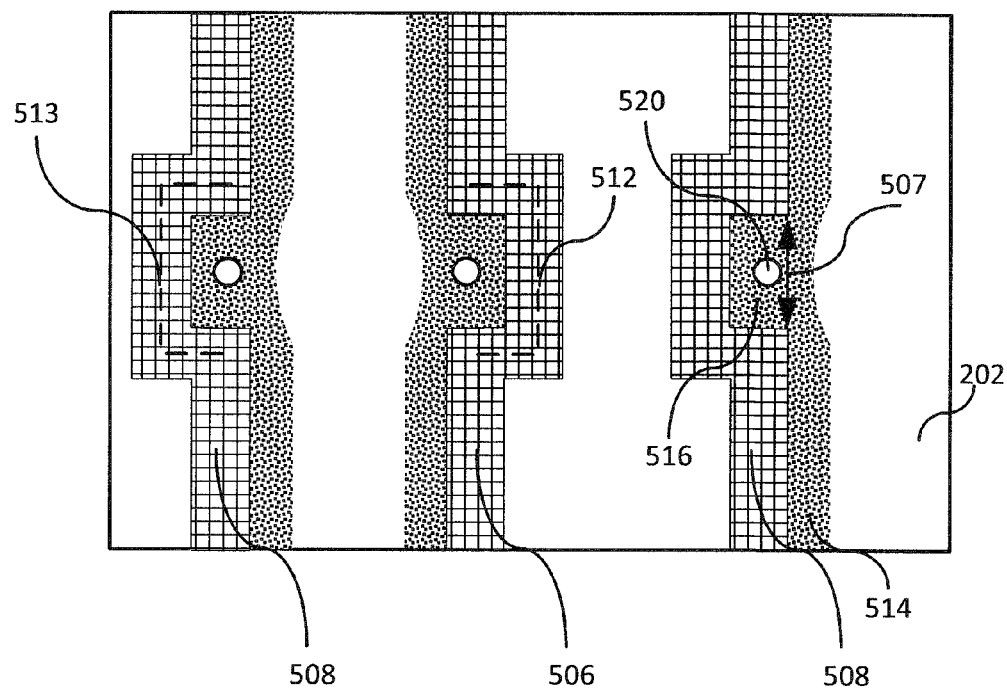

According to an embodiment, FIG. 5 illustrates a top view of a part of a layout (e.g. a part of a layout of a charge storage memory cell arrangement on a carrier) in analogy to FIG. 4, as described before. As shown in FIG. 5, a plurality of structure elements (e.g. structure elements 506 and 508) is arranged over carrier 202 including a spacer structure respectively (e.g. a sidewall spacer 514 and a remaining spacer 516). According to various embodiments, the contact landing area (e.g. the region where the remaining spacer 516 may be formed between two adjacent sidewalls of a structure element (e.g. between two adjacent sidewalls of the structure element 506 having the distance 507, e.g. between two adjacent sidewalls of the structure element 508 having the distance 507) may be enlarged by the U-shape of the structure element itself (e.g. U-shape 512 of the structure element 506, e.g. U-shape 513 of the structure element 508). According to various embodiments, electrical contacts 520 may be formed over the contact landing area (e.g. over the region formed by the remaining spacer 516). According to various embodiments, the structure elements (e.g. structure elements 506 and 508) may be a poly double stack.

Figure 6:
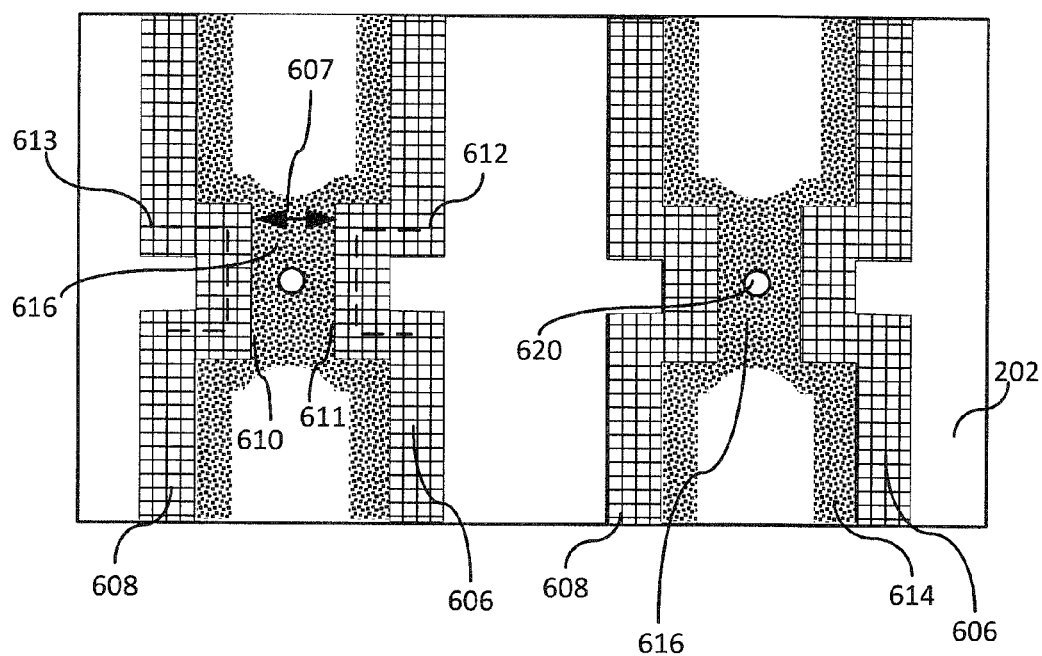
FIG. 6 schematically shows a top view of the carrier including a plurality of structure elements, wherein the structure elements are formed in a U-shape and spacer material remains between the two sidewall of a two adjacent structure element respectively, in accordance with various embodiments.

According to an embodiment, FIG. 6 illustrates a part of a layout in a top view (e.g. a part of a layout of a charge storage memory cell arrangement on a carrier) in analogy to FIG. 4 and FIG. 5 and the accompanying description. As shown in FIG. 6, a plurality of structure elements (e.g. structure elements 606 and 608) is arranged over carrier 202 including a spacer structure respectively (e.g. sidewall spacer 614 and remaining spacer 616). According to various embodiments, the contact landing area (e.g. the region where the remaining spacer 616 may be formed between two adjacent sidewalls of two adjacent structure elements, e.g. between sidewall 611 of structure element 606 and sidewall 610 of structure element 608) may be enlarged by the U-shape (e.g. U-shape 612, e.g. U-shape 613) of the structure elements 606 and 608 itself (e.g. by a poly double stack designed in a U-shape as shown in a top view in FIG. 6). According to various embodiments, the structure elements may be arranged having a distance 607 between two adjacent sidewalls of two adjacent structure elements, e.g. between sidewall 611 of structure element 606 and sidewall 610 of structure element 608. According to various embodiments, spacer material may remain between two adjacent sidewalls of two adjacent structure elements, e.g. between sidewall 611 of structure element 606 and sidewall 610 of structure element 608, after applying processes in analogy to method 100 as already described. According to various embodiments, the remaining spacer 616 may form an enlarged contact landing area. According to various embodiments, an electrical contact 620 may be formed over the enlarged contact landing area, as already described. As can be seen in FIG. 6 in accordance with various embodiments, two adjacent structure elements (e.g. structure elements 606 and 608 providing two adjacent select gates) may be electrically contacted together. In this case the operating parameter for the structure elements (e.g. the biasing scheme for operating a charge storage memory cell) may differ from the case that the two adjacent structure elements are electrically contacted individually.

According to an embodiment, FIG. 7 illustrates a part of a layout in a top view (e.g. a part of a layout of a charge storage memory cell arrangement on a carrier) in analogy to FIG. 4, FIG. 5, and FIG. 6 and the accompanying description. As shown in FIG. 7, a plurality of structure elements (e.g. structure elements 706 and 708) is arranged over carrier 202 including a spacer structure respectively (e.g. sidewall spacer 714 and remaining spacer 716). According to various embodiments, the contact landing area (e.g. the region where the remaining spacer 716 is formed between a plurality of adjacent sidewalls of two adjacent structure elements, e.g. structure element 706 and dummy structure element 710 and structure element 708 and dummy structure element 710) may be enlarged by the U-shape (e.g. U-shape 712, e.g. U-shape 713) of the structure element (e.g. structure element 706, e.g. structure element 708) supported by an additional dummy structure element (e.g. dummy structure element 710). According to various embodiments, two adjacent sidewalls (e.g. a sidewall of structure element 706 and the sidewall of dummy structure element 710, e.g. a sidewall of structure element 708 and the sidewall of dummy structure element 710) may have several distances between each other depending on the parts on the respective sidewalls being considered (e.g. distance 707 between two parts of a sidewall of structure element 708 and distance 707a between the sidewall of structure element 708 and dummy structure element 710). According to various embodiments, applying method 100 (e.g. process 120 and 130 as described before) may result in a remaining spacer structure between the structure elements. According to various embodiments, the remaining spacer 716 may form an enlarged contact landing area. According to various embodiments, an electrical contact 720 may be formed over the enlarged contact landing area.

According to an embodiment, FIG. 8 illustrates a part of a layout in a top view (e.g. a part of a layout of a charge storage memory cell arrangement on a carrier) in analogy to FIG. 4, FIG. 5, FIG. 6, and FIG. 7 and the accompanying description. As shown in FIG. 8, a plurality of structure elements (e.g. structure elements 806 and 808) is arranged over carrier 202 including a spacer structure respectively (e.g. sidewall spacer 814 and remaining spacer 816). According to various embodiments, the contact landing area (e.g. the region where the remaining spacer 816 is formed between a plurality of adjacent sidewalls of two adjacent structure elements, e.g. structure element 806 and dummy structure element 810, e.g. structure element 808 and dummy structure element 810) may be enlarged by the U-shape of the structure element (e.g. U-shape 812 of structure element 806, e.g. U-shape 813 of structure element 808) supported by an additional dummy structure element (e.g. dummy structure element 810). According to various embodiments, two adjacent sidewalls (e.g. a sidewall of structure element 806 and the sidewall of dummy structure element 810, e.g. a sidewall of structure element 808 and the sidewall of dummy structure element 810) may have several distances between each other depending on the parts on the respective sidewalls being considered (e.g. distance 807 between two parts of a sidewall of structure element 808 and distance 807a between the sidewall of structure element 808 and dummy structure element 810). According to various embodiments, applying method 100 (e.g. process 120 and 130 as described before) may result in a remaining spacer structure between the structure elements. According to various embodiments, the remaining spacer 816 may form an enlarged contact landing area. According to various embodiments, an electrical contact 820 may be formed over the enlarged contact landing area.

According to various embodiments, the shape of a dummy structure element in the top view (e.g. dummy structure element 710) as shown in FIG. 7 may be an elliptical shape, or as shown in FIG. 8 the shape of a dummy structure element (e.g. dummy structure element 810) may have an rectangular shape. According to various embodiments, other shapes may be suitable as well (e.g. a circular shape or a quadratic shape).

According to various embodiments, the shape of an electrical contact in the top view (e.g. electrical contacts 520, 620, 720) as shown in FIG. 5, FIG. 6, and FIG. 7 may be a circular shape, or as shown in FIG. 8 the shape of an electrical contact (e.g. electrical contacts 820) may have a quadratic shape. According to various embodiments, other shapes may be suitable as well (e.g. an elliptical shape or a rectangular shape).

According to various embodiments, the structure elements (e.g. structure elements 506, 508, 606, 608, 706, 708, 806, 808) may be part of a charge storage memory cell arrangement. According to various embodiments, the structure elements (e.g. structure elements 506, 508, 606, 608, 706, 708, 806, 808) may form at least a part of a charge storage memory cell arrangement (e.g. a double poly stack as for example as a part of a hot source three poly cell). According to various embodiments, the spacer structure including the sidewall spacer and the remaining spacer (e.g. sidewall spacer 414, 514, 614, 714, 814 and remaining spacer 416, 516, 616, 716, 816) may serve as at least part of a select gate structure.

According to various embodiments, a dummy structure element may be electrically insulating (e.g. dummy structure element 710 as show in FIG. 7, e.g. dummy structure element 810 as show in FIG. 8).

According to various embodiments, a method for processing a carrier may include: forming a structure over the carrier, the structure including at least two adjacent structure elements arranged at a first distance between the same; depositing a spacer layer over the structure, wherein the spacer layer may be deposited having a thickness greater than half of the first distance, wherein the spacer layer may include electrically conductive spacer material; removing a portion of the spacer layer, wherein spacer material of the spacer layer may remain in a region between the at least two adjacent structure elements; and electrically contacting the remaining spacer material.

Further, according to various embodiments, at least one structure element of the structure elements may form a part of a metal-oxide-semiconductor field-effect transistor.

Further, according to various embodiments, at least one structure element of the structure elements may form a part of a gate of a metal-oxide-semiconductor field-effect transistor.

Further, according to various embodiments, at least one structure element of the structure elements may form a part of a floating gate of a metal-oxide-semiconductor field-effect transistor.

Further, according to various embodiments, at least one structure element of the structure elements may form at least one of a floating gate and a control gate of a floating gate metal-oxide-semiconductor field-effect transistor.

Further, according to various embodiments, at least one structure element of the structure elements may be a dummy structure element.

Further, according to various embodiments, the spacer material may include silicon (e.g. polycrystalline silicon).

Further, according to various embodiments, the spacer layer may be deposited having a thickness of less than or equal to about 200 nm, e.g. less than or equal to about 150 nm, e.g. less than or equal to about 100 nm, e.g. less than or equal to about 50 nm, e.g. less than or equal to about 20 nm, e.g. less than or equal to about 10 nm, e.g. in the range of about 10 nm to about 200 nm, e.g. in the range of about 20 nm to about 200 nm, e.g. in the range of about 50 nm to about 175 nm, e.g. in the range of about 125 nm to about 175 nm, e.g. a thickness of about 150 nm.

Further, according to various embodiments, removing part of the spacer layer may include exposing the surface of the structure elements while spacer material may remain at least partially at the sidewalls of the structure elements.

Further, according to various embodiments, remaining spacer material at the sidewalls of the structure elements may provide a control line of a field-effect transistor.

Further, according to various embodiments, electrically contacting the remaining spacer material may include: depositing a masking material over the spacer layer; removing the masking material to partially expose the remaining spacer material between the structure elements; and depositing electrically conductive material contacting the remaining spacer material between the structure elements.

According to various embodiments, a method for fabricating a charge storage memory cell may include: forming a charge storage memory cell structure over a wafer, wherein the charge storage memory cell structure may include at least two adjacent charge storage memory cell structure elements arranged at a first distance between the same; depositing a spacer layer over the charge storage memory cell structure, wherein the spacer layer may be deposited having a spacer layer thickness greater than half of the first distance, wherein the spacer layer may include electrically conductive spacer material; partially removing the spacer layer, wherein spacer material of the spacer layer may remain in at least one region between the at least two adjacent charge storage memory cell structure elements; and electrically contacting the remaining spacer material.

Further, according to various embodiments, at least one charge storage memory cell structure element of the charge storage memory cell structure elements may form a part of a metal-oxide-semiconductor field-effect transistor.

Further, according to various embodiments, at least one charge storage memory cell structure element of the structure elements may form a part of a gate of a metal-oxide-semiconductor field-effect transistor.

Further, according to various embodiments, at least one charge storage memory cell structure element of the charge storage memory cell structure elements may form a part of a floating gate of a metal-oxide-semiconductor field-effect transistor.

Further, according to various embodiments, at least one charge storage memory cell structure element of the charge storage memory cell structure elements may form at least one of a floating gate and a control gate of a floating gate metal-oxide-semiconductor field-effect transistor.

Further, according to various embodiments, at least one charge storage memory cell structure element of the charge storage memory cell structure elements may be a dummy structure element.

Further, according to various embodiments, the spacer material may include silicon (e.g. polycrystalline silicon).

Further, according to various embodiments, the first distance between the at least two adjacent charge storage memory cell structure elements may be less than or equal to about 400 nm, e.g. less than or equal to about 300 nm, e.g. less than or equal to about 200 nm, e.g. less than or equal to about 100 nm, e.g. less than or equal to about 50 nm, e.g. less than or equal to about 20 nm, e.g. in the range of about 20 nm to about 400 nm, e.g. in the range of about 50 nm to about 300 nm, e.g. in the range of about 100 nm to about 250 nm, e.g. the first distance between the at least two adjacent charge storage memory cell structure elements may be about 250 nm.

Further, according to various embodiments, the spacer layer may be deposited having a thickness of less than or equal to about 200 nm, e.g. less than or equal to about 150 nm, e.g. less than or equal to about 100 nm, e.g. less than or equal to about 50 nm, e.g. less than or equal to about 20 nm, e.g. less than or equal to about 10 nm, e.g. in the range of about 10 nm to about 200 nm, e.g. in the range of about 20 nm to about 200 nm, e.g. in the range of about 50 nm to about 175 nm, e.g. in the range of about 125 nm to about 175 nm, e.g. the spacer layer may be deposited having a thickness of about 150 nm.

Further, according to various embodiments, removing part of the spacer layer may include exposing the surface of the charge storage memory cell structure elements while spacer material may remain at least partially at at least one of the sidewalls of the charge storage memory cell structure elements.

Further, according to various embodiments, the remaining spacer material at the at least one of the sidewalls of the charge storage memory cell structure elements may provide a control line of a field-effect transistor.

Further, according to various embodiments, the electrically contacting the remaining spacer material may include: depositing a masking material over at least part of the spacer layer; removing the masking material to partially expose the remaining spacer material between the charge storage memory cell structure elements; and depositing electrically conductive material contacting the remaining spacer material between the at least two adjacent charge storage memory cell structure elements.

According to various embodiments, a method for processing a chip may include: forming a structure over a substrate, wherein the structure includes at least one structure element, wherein the structure element may include at least two adjacent sidewalls facing each other arranged at a first distance between each other; depositing a spacer layer over the structure covering the at least one structure element, wherein the spacer layer may be deposited having a spacer layer thickness greater than half of the first distance between the at least two adjacent sidewalls; partially removing the spacer layer, wherein spacer material of the spacer layer may remain in at least one region between the at least two adjacent sidewalls of the at least one structure element; and electrically contacting the remaining spacer material.

Further, according to various embodiments, the electrically contacting the remaining spacer material may include: depositing a masking material over at least part of the spacer layer; removing the masking material to partially expose the remaining spacer material between the at least two adjacent sidewalls of the at least one structure element; and depositing electrically conductive material contacting the remaining spacer material between the at least two adjacent sidewalls of the at least one structure element.

According to various embodiments, a method for electrically contacting a spacer structure may include: forming a structure over a carrier, the structure may include at least two adjacent structure elements arranged at a first distance between the at least two adjacent structure elements; depositing a spacer layer over the structure covering the at least two adjacent structure elements, wherein the spacer layer may be deposited having a spacer layer thickness greater than half of the first distance, wherein the spacer layer contains electrically conductive spacer material; partially removing the spacer layer, wherein spacer material of the spacer layer remains in at least one region between the at least two adjacent structure elements thereby forming a spacer structure; and electrically contacting the spacer structure.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An electronic device comprising:
a structure over a carrier, the structure comprising two adjacent structure elements respectively formed in a U-shape so that a contact region is provided between the same;
a patterned spacer layer that provides electrically conductive spacer material in the contact region between the at least two adjacent structure elements, wherein the patterned spacer layer electrically contacts the two adjacent structure elements; and
an electrical contact disposed over the patterned spacer layer to electrically contact the patterned spacer layer,
wherein the electrically conductive spacer material is in physical contact with a sidewall of each of the two adjacent structure elements and wherein a surface of each of the two adjacent structure elements is at least partially free of the electrically conductive spacer material, and
wherein the electrically conductive spacer material at the sidewall of each of the two adjacent structure elements provides a control line of a metal-oxide-semiconductor field-effect transistor.

2. The electronic device of claim 1,
wherein each of the two adjacent structure elements is at least a part of a metal-oxide-semiconductor field-effect transistor.

3. The electronic device of claim 2,
wherein each of the two adjacent structure elements is a part of a gate of a metal-oxide-semiconductor field-effect transistor.

4. The electronic device of claim 3,
wherein the each of the two adjacent structure elements comprises a floating gate of a metal-oxide-semiconductor field-effect transistor.

5. The electronic device of claim 1,
wherein each of the two adjacent structure elements comprises at least one of a floating gate and a control gate of a floating gate metal-oxide-semiconductor field-effect transistor.

6. The electronic device of claim 1,
wherein the patterned spacer layer comprises polycrystalline silicon.

7. The electronic device of claim 1,
wherein the patterned spacer layer is electrically contacted between the two adjacent structure elements by the electrical contact.

8. A chip comprising:
a structure disposed over a substrate, wherein the structure comprises at least one structure element, wherein each of the at least one structure element comprises at least two adjacent sidewalls facing each other so that a contact region is provided between the at least two adjacent sidewalls;
a patterned spacer layer that provides electrically conductive spacer material in the contact region between the at least two adjacent sidewalls, wherein the patterned spacer layer electrically contacts the at least one structure element; and
an electrical contact disposed over the patterned spacer layer to electrically contact the patterned spacer layer,
wherein the patterned spacer layer is electrically contacted between the at least two adjacent sidewalls of each of the at least one structure element by the electrical contact,
wherein the electrically conductive spacer material is in contact with the at least two adjacent sidewalls of each of the at least one structure element and wherein a surface of each of the at least one structure element is at least partially free of the electrically conductive spacer material, and
wherein the electrically conductive spacer material at the at least two adjacent sidewalls of each of the at least one structure element provides a control line of a metal-oxide-semiconductor field-effect transistor.

9. The chip of claim 8,
wherein each of the at least one structure element comprises at least one of a floating gate and a control gate of a floating gate metal-oxide-semiconductor field-effect transistor.

10. The chip of claim 8,
wherein the patterned spacer layer comprises polycrystalline silicon.

11. A chip comprising:
a structure disposed over a substrate, wherein the structure comprises two structure elements, wherein each of the two structure elements comprises at least two adjacent sidewalls facing each other so that each of the two structure elements further comprises a third sidewall, wherein the two third sidewalls of the two structure elements are facing each other so that a contact region is provided between the two third sidewalls of the two structure elements;
a patterned spacer layer that provides electrically conductive spacer material in the contact region between the two third sidewalls of the two structure elements, wherein the patterned spacer layer electrically contacts the two structure elements; and
an electrical contact disposed over the patterned spacer layer to electrically contact the patterned spacer layer,
wherein each of the two structure elements comprises at least one of a floating gate and a control gate of a floating gate metal-oxide-semiconductor field-effect transistor, and
wherein the electrically conductive spacer material between the two third sidewalls of the two structure elements provides a single control line for the two floating gate metal-oxide-semiconductor field-effect transistors.

12. The chip of claim 11,
wherein the patterned spacer layer comprises polycrystalline silicon.

13. The chip of claim 11,
wherein the electrically conductive spacer material is in physical contact with the two third sidewalls of the two structure elements.

14. A chip comprising:
a structure disposed over a substrate, wherein the structure comprises at least one structure element, wherein each of the at least one structure element comprises at least two adjacent sidewalls facing each other so that a contact region is provided between the at least two adjacent sidewalls;
a patterned spacer layer that provides electrically conductive spacer material in the contact region between the at least two adjacent sidewalls, wherein the patterned spacer layer electrically contacts the at least one structure element; and
an electrical contact disposed over the patterned spacer layer to electrically contact the patterned spacer layer,
wherein the electrically conductive spacer material is in contact with the at least two adjacent sidewalls of each of the at least one structure element and wherein a surface of each of the at least one structure element is at least partially free of the electrically conductive spacer material, and
wherein the electrically conductive spacer material at the at least two adjacent sidewalls of each of the at least one structure element provides a control line of a metal-oxide-semiconductor field-effect transistor.

15. The chip of claim 14,
wherein each of the at least one structure element comprises at least one of a floating gate and a control gate of a floating gate metal-oxide-semiconductor field-effect transistor.

16. The chip of claim 14,
wherein the patterned spacer layer comprises polycrystalline silicon.

* * * * *